US010747538B2

(12) United States Patent
Mouchel La Fosse et al.

(10) Patent No.: US 10,747,538 B2
(45) Date of Patent: Aug. 18, 2020

(54) METHOD AND APPARATUS TO RE-CONFIGURE MDIO REGISTERS ON AN ETHERNET DEVICE

(71) Applicant: Intel Corporation, Santa Clara, CA (US)

(72) Inventors: Eric Mouchel La Fosse, Singapore (SG); Paul Louis Chazhoor, Singapore (SG); Chee Kiang Goh, Singapore (SG); Hak Keong Sim, Singapore (SG)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 16/229,771

(22) Filed: Dec. 21, 2018

(65) Prior Publication Data

US 2020/0201637 A1 Jun. 25, 2020

(51) Int. Cl.
| | |
|---|---|
| *G06F 9/30* | (2018.01) |
| *H03K 19/17748* | (2020.01) |
| *H03K 19/17736* | (2020.01) |
| *G06F 9/38* | (2018.01) |

(52) U.S. Cl.
CPC ........ *G06F 9/30098* (2013.01); *G06F 9/3836* (2013.01); *H03K 19/17744* (2013.01); *H03K 19/17748* (2013.01)

(58) Field of Classification Search
CPC .............. G06F 9/30098; G06F 9/3836; H03K 19/17744; H03K 19/17748
See application file for complete search history.

(56) References Cited

U.S. PATENT DOCUMENTS

| | | | |
|---|---|---|---|
| 6,842,034 B1 * | 1/2005 | Chan ................ | H03K 19/17732 326/37 |
| 7,751,442 B2 * | 7/2010 | Chang .................... | H04L 12/40 370/389 |
| 9,588,770 B2 | 3/2017 | Burgess et al. | |
| 10,601,737 B2 * | 3/2020 | Lillie .................... | H04L 49/252 |
| 2009/0287809 A1 * | 11/2009 | Chen ................... | H04L 41/0896 709/223 |

* cited by examiner

*Primary Examiner* — Hashim S Bhatti
(74) *Attorney, Agent, or Firm* — 2SPL Patent Attorneys PartG mbB

(57) ABSTRACT

An Ethernet device comprises a plurality of Management Data Input/Output (MDIO) Manageable Device (MMD) registers storing Ethernet register field definitions that operate a management interface to one or more MMD devices. An MDIO controller, communicatively coupled to the plurality of MMD registers can control communication via the management interface to the one or more MMD devices based on a mapping of the set of Ethernet register field definitions to the plurality of MMD registers, and dynamically modify the mapping of the set of Ethernet register field definitions to the plurality of MMD registers.

24 Claims, 14 Drawing Sheets

Clause 45

| Frame | PRE | ST | OP | PRTAD | DEVAD | TA | ADDRESS / DATA | IDLE |
|---|---|---|---|---|---|---|---|---|
| | | | | Management frame fields | | | | |
| Address | 1…1 | 00 | 00 | PPPPP | EEEEE | 10 | AAAAAAAAAAAAAAAA | Z |
| Write | 1…1 | 00 | 01 | PPPPP | EEEEE | 10 | DDDDDDDDDDDDDDDD | Z |
| Read | 1…1 | 00 | 11 | PPPPP | EEEEE | 20 | DDDDDDDDDDDDDDDD | Z |
| Post-read-increment-address | 1…1 | 00 | 10 | PPPPP | EEEEE | 20 | DDDDDDDDDDDDDDDD | Z |

Clause 22

Management frame fields

| | PRE | ST | OP | PHYAD | REGAD | TA | DATA | IDLE |
|---|---|---|---|---|---|---|---|---|
| READ | 1..1 | 01 | 10 | AAAAA | RRRRR | Z0 | DDDDDDDDDDDDDDDD | Z |
| WRITE | 1..1 | 01 | 01 | AAAAA | RRRRR | 10 | DDDDDDDDDDDDDDDD | Z |

METHOD AND APPARATUS TO RE-CONFIGURE MDIO REGISTERS ON AN ETHERNET DEVICE

FIELD

The present disclosure relates to networking architectures and methods for re-configuring Management Data Input/Output (MDIO) registers on an Ethernet device.

BACKGROUND

Ethernet devices can operate according to the IEEE 802.3 standard, and more specifically to communications that comply with the IEEE 802.3 clause 22, a clause 22 extensions, or clause 45 formats. Some registers of an Ethernet device are published mandatorily, others can optionally be published depending on product feature support, and other registers can be "Vendor Specific", which can be used to customize proprietary functions. These registers can also be accessible by a management entity (e.g. a Host PC or processing controller also called Station Management (STA) in the IEEE 802.3 standard) using a Management Data Input/Output (MDIO) protocol and a MDIO controller implemented in hardware on an Ethernet physical layer Integrated Circuit, for example.

Some register fields can also support behavior defined by the IEEE standard. For example, a "Clear on Read" is an operation field indicating to clear to zero after a read from the STA. In another example, a "Reserved" field can indicate that a write from STA has no effect, where a read is always zero.

With possible standard evolution, or change of a feature-set, there is a need to update register field definition, behavior, or add registers to be published based on the MDIO or MMD device. Beforehand, MDIO-Management device (MMD) definition updates only utilized a hardware re-spin or re-fabrication because of, for example, the tight coupling of registers with the MDIO controller implemented in hardware. The execution of a behavior associated with a field is also usually utilized to generate an interrupt to a microcontroller to implement the field clearing after read or masking a write to a reserved field.

BRIEF DESCRIPTION OF THE DRAWINGS

FIG. 6 is an example clause 45 frame in accordance with various aspects described.

FIG. 11 is an example clause 45 frame in accordance with various aspects described.

DETAILED DESCRIPTION

Figure 1:
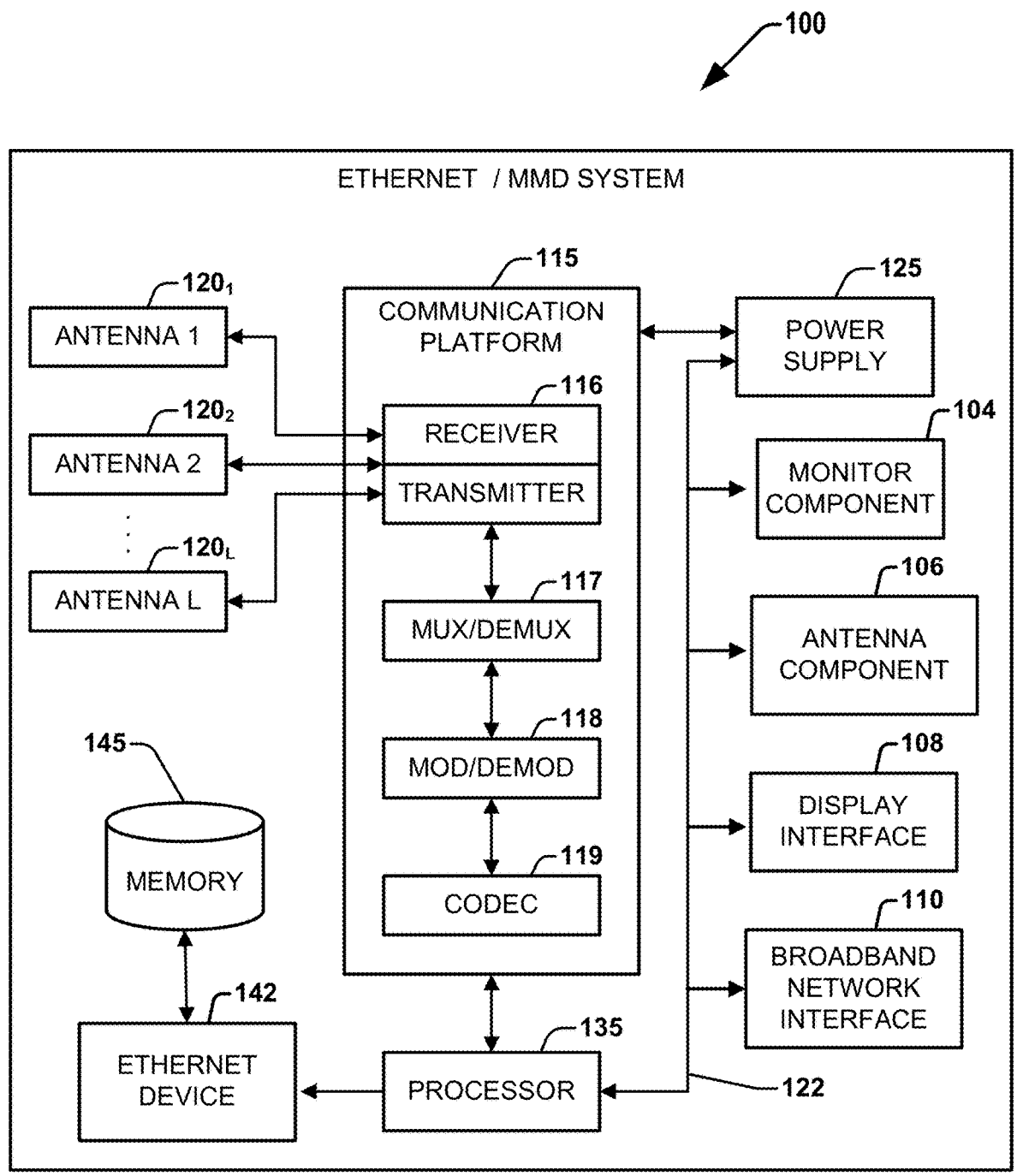
FIG. 1 illustrated is example of network device according to various aspects (embodiments) described as an implementation example.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (UE) (e.g., mobile/wireless phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

In consideration of described deficiencies of Ethernet devices and associated registers of an Ethernet device for communication with an MMD device the definitions can be structured to be dynamically re-configurable or upgradeable instead of having to re-spin or re-fabricate the device or hardware chip. Various embodiments or aspects can enable a hardware implementation to configure the MDIO hardware controller of an Ethernet device or circuit to be able to interpret different combinations of MDIO-MMD registers with different field definitions, quantities and allocations per MMD device in a flexible manner by complying with the standard definition and directing requests or commands based on a dynamically configured mapping or modified mapping of the MMD registers, for example.

In one example, an Ethernet device can comprise a plurality of MMD registers comprising a set of Ethernet register field definitions, and an MDIO controller, communicatively coupled to the plurality of MMD registers. The MDIO controller can be configured to enable communications via an interface based on a set of Ethernet register field definitions with one or more physical layers of at least one MMD device and a re-mapping of the set of Ethernet register field definitions to the plurality of MMD registers. Instead of only a one-to-one hardware mapping between the registers and their definitions or an MMD device, multiple registers can be mapped to different definitions or MMD devices dynamically, without a hardware re-spin or re-fabrication, while complying with the standard Ethernet requests associated with an initial standard Ethernet device. The MDIO controller can thus be configured to further re-map the definitions to generate a re-configured mapping of the set of Ethernet register field definitions to the plurality of MMD registers such as by re-configuring bits of the plurality of MMD registers. Such a dynamic re-configuration can be based on at least one or more bits of an MMD register or registers being associated with different criteria, and be altered according to a user modification or the need for directing resources different from MMD devices or the like. The bits of the MMD register(s) can be re-configured based on a first criteria of the Ethernet register field definitions to a second criteria that is different from the first criteria. As such, the criteria or definition field, for example, associated with the MMD registers can be utilized according to Ethernet standards, but re-mapped on the MDIO controller so that the Ethernet protocol definitions are identified and the current re-configured physical address of the register or bits of the register are properly addressed to enable the types of communications or requests being communicated by an external MMD device.

The criteria can include a reset value, a number of registers associated with an MMD device, a number of published registers, a function/activity that is associated with an operation/command, or a particular MMD device assignment to a particular register, for example. As such, different MMD registers can be re-configured to be associated with or mapped to one or more different criteria, which can change based on a proprietary function, a standard change, or other trigger such as a device command or need for resources/different functioning, for example.

In one example, the first criteria can be a first operation that comprises a function related to a read command or a published register address, for example, and the second criteria can comprises a second operation that comprises a function related to the read command or a different published register address. These functions can include an action or command to perform with an operation (e.g., a read, a reserve, a write operation/command, or other memory address command). The action or command can be a clear-on-read (clear on read), a mask-on-read (mask on read), a mask-on-write (mask on write), a reserve, or other such action. For example, a clear on read (or clear-on-read) can be a clearing of the register or associated bits after or upon a read operation being executed thereat. Likewise, with a clear on write, a clearing or erasing of the register or associated mapped bits to the command after or upon a write operation being execute thereat. The same applies with other actions or commands that can be associated with a reserve, masking or other operation, as with the write or read operation to the MMD register(s).

Advantages to various aspects/embodiments can be realized, for example, when the IEEE 802.3 standard evolves, as it happened in the past from versions with the addition of clause 45 to clause 22. Thus, the same Ethernet PHY device can be reconfigured by a change to a new MDIO-MMD register definition without reconfiguring the Ethernet hardware. Similarly if a customer proprietary feature is added in the Vendor Specific register bank, this can also be done with a re-mapping of definitions such as with software, without a hardware re-spin.

Additional aspects and details of the disclosure are further described below with reference to figures.

In order to provide context for various aspects of the disclosed subject matter, FIG. 1 illustrates a non-limiting example of a computing system, such as a gateway network device (e.g., an MMD device communicatively coupled to an Ethernet device) 100 that can implement some or all of the aspects/components described herein. An MMD device can be referred to as a wired bus (e.g., a two wire serial bus or the like) with a physical (PHY) layer or physical layer devices operably coupled to a media access controller (MACs) with Gigabit equipment, for example, in compliance with IEEE 802.3 and configured to access up 32 different PHY devices/MMD devices.

In an example environment, a terminal 100, such as data terminal equipment, a laptop, tablet, other communication device, can receive and transmit signal(s) to and/or from devices such as access points, access terminals, wireless ports and routers, as well or the like, through an interface 122 (e.g., an MDIO interface) in accordance with a set of Ethernet protocol definitions, or IEEE 802.3 register definitions based on clause 22, clause 45, or both.

The PHY devices can comprise one or more other components also such as a set of L antennas 120. In one example, antennas 120 can be implemented as part of a communication platform 115, which in turn can comprise electronic components and associated circuitry and/or other means that provide for processing and manipulation of received signal(s) and signal(s) to be transmitted between. The antennas 120 can comprise the various antenna elements incorporating the different aspects or embodiments disclosed herein.

In an aspect, communication platform 115 can include various other components such as a monitor component 104 and antenna component 106, which can couple to communication platform 115 and include electronic components with associated circuitry that provide for processing and manipulation of received signal(s) and other signal(s) to be transmitted. The communication platform 115 can further comprise a receiver/transmitter or transceiver 116, which can transmit and receive signals and/or perform one or more processing operations on such signals (e.g., conversion from analog to digital upon reception, conversion from digital to analog upon transmission, etc.). In addition, transceiver 116 can divide a single data stream into multiple, parallel data streams, or perform the reciprocal operation.

The communication device 100 can also include a display interface 108, which can display functions that control functionality of the device 100, or reveal operation conditions thereof. In addition, display interface 108 can include a screen to convey information to an end user. In an aspect, display interface 108 can be a liquid crystal display, a plasma panel, a monolithic thin-film based electro chromic display, and so on. Moreover, display interface 108 can include a component (e.g., speaker) that facilitates communication of aural indicia, which can also be employed in connection with messages that convey operational instructions to an end user. Display interface 108 can also facilitate data entry (e.g., through a linked keypad or through touch gestures), which can cause access equipment and/or software 100 to receive external commands (e.g., restart operation).

Broadband network interface 120 facilitates connection of access equipment and/or software 100 to a service provider network (not shown) that can include one or more cellular technologies (e.g., third generation partnership project universal mobile telecommunication system, global system for mobile communication, and so on) through backhaul link(s) (not shown), which enable incoming and outgoing data flow. Broadband network interface 110 can be internal or external to access equipment and/or software 100, and can utilize display interface 108 for end-user interaction and status information delivery.

Processor 135 can be functionally connected to communication platform 108 (as the DPU 110) and can facilitate operations on data (e.g., symbols, bits, or chips) for multiplexing/de-multiplexing, such as effecting direct and inverse fast Fourier transforms, selection of modulation rates, selection of data packet formats, inter-packet times, and so on. Moreover, processor 135 can be functionally connected, through data, system, or an address bus, to display interface 108 and broadband network interface 110, to confer, at least in part, functionality to each of such components.

In another example, a multiplexer/de-multiplexer (mux/demux) unit 117 can be coupled to transceiver 116. Mux/demux unit 117 can, for example, facilitate manipulation of signal in time and frequency space. Additionally or alternatively, mux/demux unit 117 can multiplex information (e.g., data/traffic, control/signaling, etc.) according to various multiplexing schemes such as time division multiplexing (TDM), frequency division multiplexing (FDM), orthogonal frequency division multiplexing (OFDM), code division multiplexing (CDM), space division multiplexing (SDM), or the like. In addition, mux/demux unit 117 can scramble and spread information according to substantially any code generally known in the art, such as Hadamard-Walsh codes, Baker codes, Kasami codes, polyphase codes, and so on.

In a further example, a modulator/demodulator (mod/demod) unit 118 implemented within communication platform 115 can modulate information according to multiple modulation techniques, such as frequency modulation, amplitude modulation (e.g., L-ary quadrature amplitude modulation (L-QAM), etc.), phase-shift keying (PSK), or other modulation operations. Further, communication platform 115 can also include a coder/decoder (codec) module (component) 119 that facilitates decoding received signal(s) and/or coding signal(s) to convey or communicate between devices, such as an Ethernet device 142 via an Ethernet cable interface.

According to another aspect, terminal 100 can include a processor 135 configured to confer functionality, at least in part, to substantially any electronic component utilized by terminal 100 such as the Ethernet device circuit 142. As further shown in system 100, a power supply 125 can attach to a power grid and include one or more transformers to achieve a power level at which various components and/or circuitry associated with terminal 100 can operate. In one example, power supply 125 can include a rechargeable power mechanism to facilitate continued operation of terminal 100 in the event that the terminal 100 is disconnected from the power grid, the power grid is not operating, etc. The antennas, for example, with the other antenna element configurations can further facilitate communications with a wireless charging of the power supply 125, such as with a transfer of energy from the antenna system to the power supply 125 via an oscillating magnetic field, for example.

In a further aspect, processor 135 can be functionally connected to communication platform 115 and can facilitate various operations on data (e.g., symbols, bits, chips, etc.), which can include, but are not limited to, effecting direct and inverse fast Fourier transforms, selection of modulation rates, selection of data packet formats, inter-packet times, etc. In another example, processor 135 can be functionally connected, via a data or system bus (e.g., a wireless PCIE or the like), to any other components or circuitry not shown in system 100 to at least partially confer functionality to each of such components, such as by the antenna systems disclosed herein.

As additionally illustrated, a memory 145 can be used by terminal 100 to store data structures, code instructions and program modules, system or device information, code sequences for scrambling, spreading and pilot transmission, location intelligence storage, determined delay offset(s), over-the-air propagation models, and so on according to any memory or memory component (e.g., registers for MIDO or other related components). Memory 145 can also include one or more MMD registers. These MMD registers can include published registers that are public, non-published registers not freely available or known publicly, or Vendor specific registers for customized/proprietary functions associated thereto, as well as Ethernet control registers, which can support one or more functions or behavior as defined by the IEEE Ethernet standard, for example. Processor 135 can be coupled to the memory 145 in order to store and retrieve information necessary to operate and/or confer functionality to communication platform 115 and/or any other components of terminal 100.

An Ethernet device 142 can operate to communicate between the various components 104-135 as separate MMD devices, external MMD devices, or both separate and external MMD devices. Each MMD device can have a separate processor 135 and memory 145 with MMD registers, for example, based on a set of Ethernet register definitions according to clause 22, clause 22 extendible, clause 45, or the like, for example. Each clause defines the logical and electrical characteristics of an extension to a two signal Management Data Input/Output (MDIO) interface 122, which can be a serial interface, for example, specified in clause 22 and clause 45 of IEEE 802.3. Clause 45 can be purposed as an extension that is to provide the ability to access more device registers while still retaining logical compatibility with the MDIO interface 122. Clause 22, for example, specifies the MDIO frame format and uses an ST code of 01 to access registers, for example, and in clause 45 additional registers are added to the address space by defining MDIO frames that use an ST code of 00. These aspects can be applicable to the MDIO interface is applicable to Ethernet implementations that operate at speeds of 10 Gb/s and above.

These clauses can define operation for a management interface (e.g., interface 122) between the processor 135, a processor of the Ethernet device 142, or otherwise as a Station Management (STA) and the sublayers that form a 10 Gb/s Physical Layer device (PHY) entity or MMD devices. Where a sublayer, or grouping of sublayers, is an individually manageable entity, it is known as an MDIO Manageable Device (MMD). In an aspect, the MDIO interface 122 can support up to a maximum of 65,536 registers in each MMD, but not necessarily limited herein to any other number, for example.

A problem can arise with a possible standard evolution, or a change in a feature-set, a change in a proprietary function, or a need to change register definitions in the Ethernet device 142 for different functions or behavior of the Ethernet device 145 or Ethernet interface 122. As such, with possible standard evolution, change in functions associated with the MMD registers, or the like, there is a need to update register field definition(s), behavior(s), or add registers to be published per MDIO or per MMD device. In particular, a MDIO-MMD definition update could require a hardware re-spin, or re-fabrication, especially due to even more closer coupling of registers with the MDIO controller implemented in hardware.

Further, the execution of a behavior associated to a register field has previously operated to generate an interrupt to a microcontroller to implement the field clearing after read or masking a write to a reserved field.

In various embodiments or aspects, MDIO-MMD register descriptions or definitions can be modified or changed to be upgradeable or dynamically reconfigurable. As such, the MDIO controller as the processor 135, or a processor of the Ethernet device 142 is configured to interpret all combinations of MMD registers field definition(s) (or re-mapped standard Ethernet field definitions/Ethernet protocol definitions), quantity and allocation per MMD device in a flexible or dynamic way.

If the IEEE 802.3 standard evolves, for example, as it has happened in the past version with the addition of clause 45 to clause 22, the same Ethernet PHY device can be reconfigured by a change of software with a new MDIO-MMD register definition. Similarly, if a customer proprietary feature (with a change to different actions/commands with one or more operations) is added in the Vendor Specific register bank this can be done with a software only solution, without a hardware re-spin.

Figure 2:
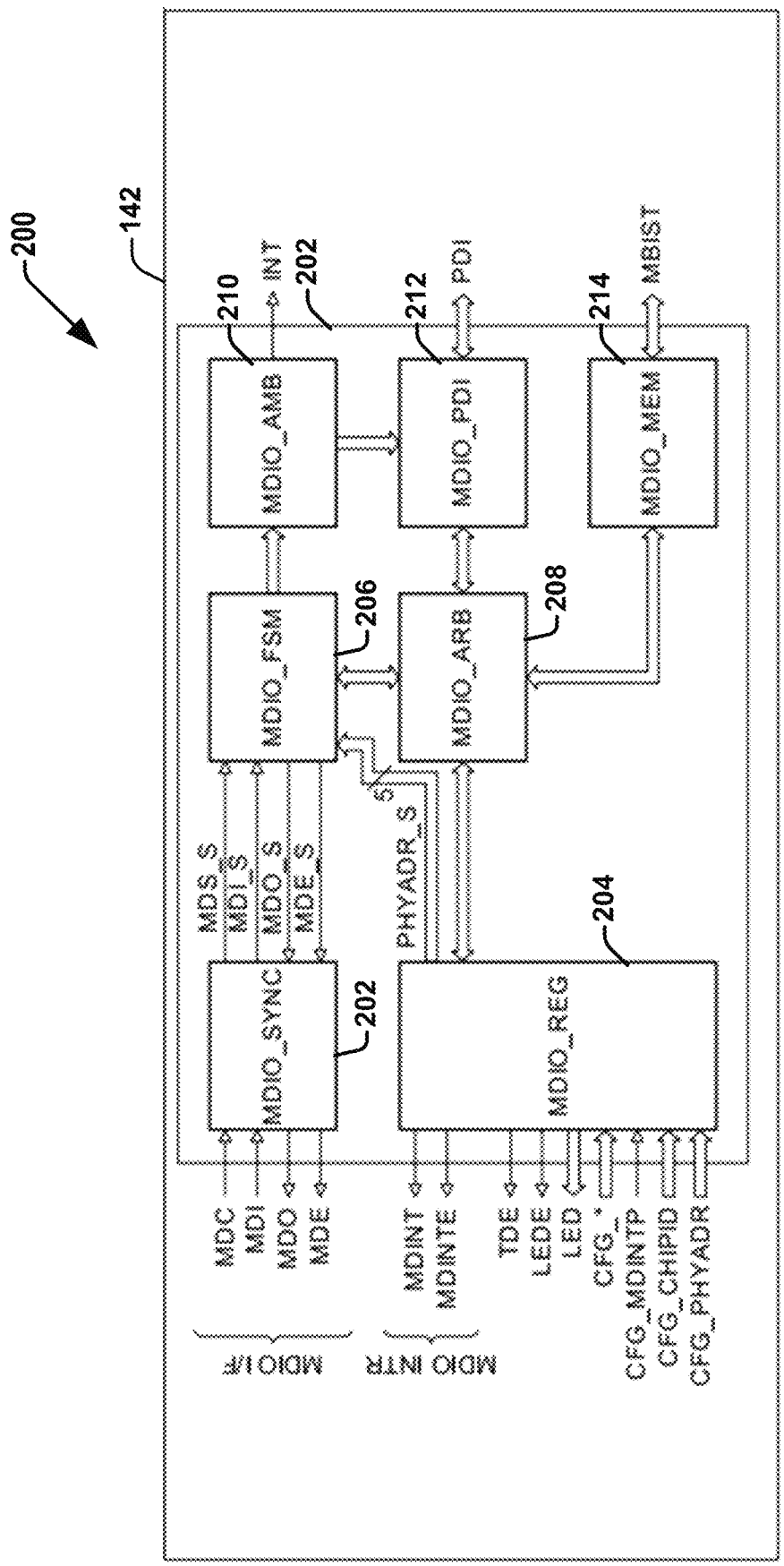
FIG. 2 illustrated is example of Management Data Input/Output (MDIO) controller according to various aspects described.

Referring to FIG. 2, illustrated is an MDIO controller or interface module block 202 of a processor 135 coupled to or integrated with one or more Ethernet PHY devices (e.g., device(s) 142) configuring an MDIO reconfigurable register for flexibly re-configuring definitions that are standard Ethernet field definitions with an MMD device. As such, the MDIO controller 200 can operate to re-configure Ethernet register field definitions associated with internal memory of the Ethernet device (e.g., device 142 of FIG. 1) or processor 135, and process incoming requests/commands based on the Ethernet field definitions/Ethernet protocol definitions being mapped to a correct physical address.

The MDIO controller 200, for example, can be configured as a part of a processing unit, integrated processor or chip (IC), or a co-processor platform, and operable to provide and receive inputs/outputs externally to MMD devices and internally such as to a processor sub-system with a core processor and associated components via input/output ports according to various protocols (e.g., UART, 120, LED, MDIO, AHB-Lite, PDI, JTAG, or the other such I/O protocols) for operation. As such, the MDIO controller 200 comprising MDIO lines, including an MDO, MDC, MDI, and MDE, including clocking mechanism(s) so that the register core microprocessor can read the registers.

The MDIO controller 200 of the Ethernet device 142 can comprise an MDIO sync component 202, an MDIO register component with a plurality of MDIO registers 204, an MDIO finite state machine (FSM) 206, an MDIO arbitrator (ARB) 208, an MDIO AMB 210 component for accelerator hardware or the like, an MDIO process data interface (PDI) component 212, and an MDIO memory component 214. The MDIO_SYNC 202 comprises the MIDO interfaces (MDIO I/F) that synchronizes as shown to accept different signals on the cellular interface according to the input and output terminals illustrated, such as data terminals for the MMD clock cycles on MDC, MMD output MDO, MMD input (MDI), or MMD enable (MDE), for example. The MDIO_FSM 206 comprises a finite state machine to decode the data frames being received, such as an MDIO carrier frame received, and then goes through the MDIO memory 204 that is configurable memory with a flexible mapping.

The microcontroller chip or processor (e.g., 135) at the chip initialization can configure a physical memory table (e.g., at 204 or 214) inside the MDIO block, which describes the registers at the register fields in memory so which register are at which physical address at the MDIO register component 204. The register number can be allocated to which MMD device. Specifically, these registers have a number, but they also have a device number, as we as a subsection for a device number per register, as by a one to one mapping with register to MMD device (number). The MDIO processor (e.g., 202 of processor 135 separately or integrated with the Ethernet device 142 with interface 122) can be configured to enable flexible and reconfigurable at initialization by the MDIO microcontroller 135, for example. The microcontroller 135 upon chip initialization can initialize the behavior for each of the registers, clear on the read, clear on write, a generic interruption to the microcontroller upon read or write, as well as initialization value for the default value at the chip input for the register. The MDIO controller can further re-configure each of these actions associated with an operation as well as re-configure to which one or more MMD devices are associated with one or more registers, or the bits of a register dynamically without need to re-spin the hardware. This is what can change, this is based on software, so the chip can change software and we do not need to re-spin the hardware.

Figure 3:
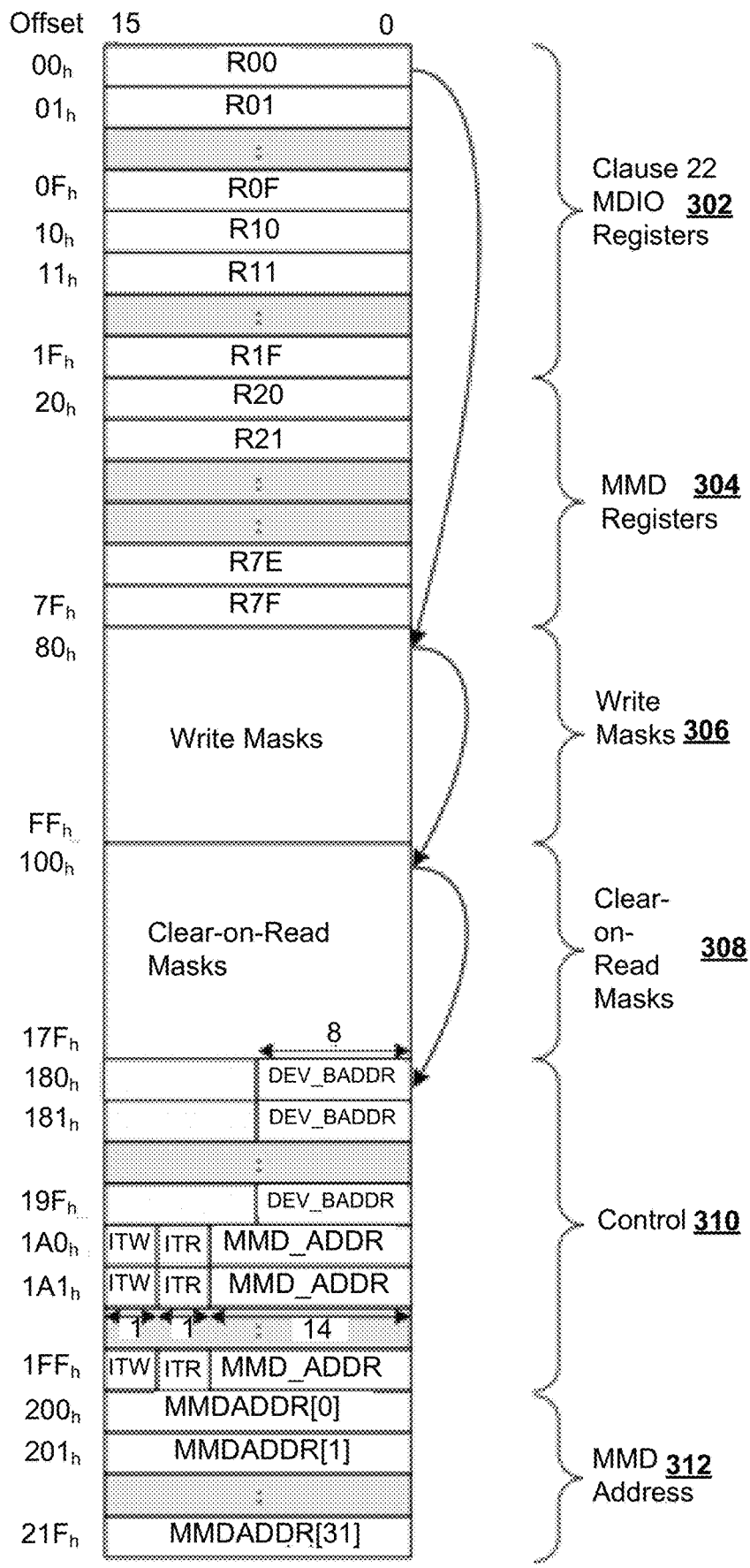
FIG. 3 is an example re-configurable register definition format in a memory region to be upgraded to modify definition and behaviors/activities according to various aspects described.

Referring to FIG. 3, illustrated is an example of the MDIO re-configurable memory with a plurality of registers 300. At chip initialization, the MDIO controller 135 or MDIO block 202 can configure a memory table inside the MDIO block 202 in at least one of the components associated with the register 204, FSM 206, memory 214, or the like). This table 300 contains: the description of registers (IEEE standard register number, allocation to MMD device); standard behavior for each register (Clear on Read, Clear on Write, interrupt the micro-controller upon read or write); register initialization value (reset values).

The configurable memory 300 can be categorized or divided into five portions: MDIO/MMD Register content 302 and 304, Bit-wise Write mask 306, Bit-wise Clear-on-read mask 308, Control information 310, and MMD Addresses 312. A one-to-one mapping can be configure for the first 4 regions 302-308. The arrows in the figure show an example of the relationship of the first MDIO/MMD register R00 at 00h, with write mask 306 at 80h, clear on read mask 308 at 100h, and control address 310 DEV_BADDR at 180h, for example. Likewise, each subsequent MDIO and MMD register 302, 304 can follow a similar subsequent relationship association.

The IT field (e.g., ITW or ITR at 1A0h or a subsequent address as a bit) in the control information 310 can be configured to indicate whether an interrupt is to be raised to the processor 135 of the device 142, for example. The DEV_ADDR field of the control information 310 in the first 32 locations can correspond to the base address into the MDIO memory respectively for MMD=0 to MMD=31, for example. This can be used as the starting address to the MDIO memory to direct the start of the search for the MMD register in the corresponding MMD Device address. The MMD_ADDR of the control 310 can be the actual MMD address mapped within each MMD device space to register bits of an MMD device, in which the MMD addresses can be supported up to 14-bit(s). Additionally, the last region MMD address 312 holds the current MMD addresses for the 32 devices. These addresses 312 are provided in the MDIO frames either Clause 22 or 45 as communications processed and the hardware stores the information here.

At the MDIO registers 302, thirty-two registers can belong to MMD Device 0, which can be allocated one to one into physical memory without need for a search process performed by the processor to retrieve their physical address; as Device 0 can be the only device available for clause 22. At the MMD registers 304, a memory area can be configured here with flexible memory allocation of up to 96 MMD registers, which can belong to or be associated to any number of Devices 1 thru 30/31. The DEV_BADR (180h to 19Fh) in control information fields 310 can be a base address (BADR) index of the Devices 1 to 31, for example. Further at the control information fields 310, the MMD_ADDR can be the Standard IEE MDIO register address corresponding to the physical address in memory of offset 20 thru 7F [20:7F]; while the MMD addresses or MMD address space 312, MMDADDR[0:31] store the last programmed IEEE MDIO register address for each of the 31 devices. This IEEE MDIO register address for each of the 31 devices has a Value, respectively, that is latched when an Address Transaction is received using either clause (clause 22/22 extension, or clause 45).

In an aspect, a flexible mapping, re-configuration, or re-mapping of the actions/commands associated with different operations can be configured so that different combinations of MDIO-MMD registers can be associated with different field definitions, quantities, reset values, or allocations to a different MMD device dynamically. For example, one or more bits of MMD register(s) being associated with different criteria, and be altered dynamically during communication, connection to a different/additional MMD device, or at chip initialization (e.g., processor 135 or other core processor/co-processor of the Ethernet device 142), according to a user modification or the need for directing resources different from MMD devices or the like.

For example, the bits of the MMD register(s) can be re-configured based on a first criteria of the Ethernet register field definitions to a second criteria that is different from the first criteria. As such, the criteria or definition field, for example, associated with the MMD registers can be utilized according to Ethernet standards as addressed in the MMD address 312, but re-mapped on the MMD controller in the control portion 310 so that the Ethernet protocol definitions are identified and the current re-configured physical address of the register or bits of the register are properly addressed to enable the types of communications or requests being communicated by an external MMD device (e.g., any one component or MMD device 104, 106, 108, 110, 115 or other components or devices up to about 32 devices).

The criteria can include a reset value, a number of register(s)/bit(s) associated with a particular MMD device, a number of published registers, a function/activity that is associated with an operation/command, or a particular MMD device assignment to a particular register, for example. As such, different MMD registers can be re-configured to be associated with or mapped to one or more different criteria, which can change based on a proprietary function, a standard change, or other trigger such as a device command or need for resources/different functioning.

In an aspect, a standardized MDIO frame cellular command for read and write operation can be processed via the FSM 206 to ultimately address the memory address that corresponds to the access activity desired. As such, an indirect addressing or mapping from a standardized logical number for a register into a flexible MDIO memory mapping corresponding to the user mapping can be configured and re-configured dynamically.

In one example, the first criteria can be a first operation that comprises a function related to a read command or a published register address, for example, and the second criteria can comprises a second operation that comprises a function related to the read command or a different published register address. These functions can include an action of a command (e.g., reserve, reset value, clear on read, clear on write, publish, mask on read, mask on write, or the like) to perform with an operation (e.g., a read, a reserve, a write operation/command, or other memory address command). The action or command can be a clear-on-read (clear on read), a mask-on-read (mask on read), a mask-on-write (mask on write), a reserve, or other such action. For example, a clear on read (or clear-on-read) can be a clearing of the register or associated bits after or upon a read operation being executed thereat. Likewise, the same applies with other aspects described such as with other actions/commands.

A clear on write, for example, can be initially associated with a first MMD device 104 for a first register or first subset of bits within the first register R00 for clause 22 MDIO registers 302. The actual address according to Ethernet standard can be directed or found at MMDADDR[0] of MMD addresses 312 upon receiving a communication from an MMD device and one to one mapped according to the arrows as illustrated. This MMDADDR[0] comprises a programmed IEE MDIO register address for the associated device (e.g., one of 31). The value can be latched when an address transaction is received, for example. Initially this address can correspond to one of the 31 devices. This address also can be associated with any one of a number of actions (e.g., clear on write) corresponding to the operation (e.g., a write operation) being requested at the MMDADDR [0]. The actual MMD address of the Control 310 mapped thereto can direct to the registers or bits associated with the MMD device based on the command as well as via the arrows as indicated. The IT field (e.g., ITW or ITR at 1A0h or a subsequent address as a bit) in the control information 310, for example, indicates whether an interrupt is to be raised to the processor 135 as well as the type of operation it is associated with (e.g., write, read, etc.). The DEV_ADDR field of the control information 310 in the MMD Registers 304 or the first 32 locations maps as the base address into the MDIO memory respectively for MMD=0 to MMD=31, for example. This can be used as the starting address to the MDIO memory to direct the start of the search for the MMD register in the corresponding MMD Device address and acquiring of particular activities/actions/behaviors by which to operate in association. As such, the MMD_ADDR of the control 310 can be the actual MMD address mapped within each MMD device space to register(s) or register bits at 302/304 as well as their associations to write masks 306 and clear on read masks 308 spaces.

Thus, each of the MDIO registers 302 can be reconfigured to different MMD devices, different actions associated with operations, whether they are published or not, or the like as described in criteria herein. In an aspect, there can be up to 32 MMD devices and each of the MMD device can have registers associated from within the configurable memory 300. In other words, registers 0h to 7Fh can be allocated to one device while other MMD devices can be allocated to the various MMD registers 304 (e.g., about 96 registers) in a one to one mapping and then in a different mapping (not one to one, as a different one to one mapping or a different plurality to plurality mapping) in a configurable way.

In an aspect, a stop address of the MMD devices can be provided at the bottom as an address in a corresponding register MMD address 312 as a way to configure this re-configurability as a stop address of the MMD devices. The address here at 312 can afterwards from 200h to 21Fh indicate the status of some MMD device for the MMD registers 304 (or 302) as a group of registers for MMD device 0, and which an address stop is for the register for MMD device one and so on, etc. Some of the device addresses can be empty as a configuration at bottom from 200h to 21Fh. Then after a determination can be made on whether reading or writing this according to the address at bit ITW and ITR, a selection of the behavior corresponding to the device MMD address.

In an example, the activity or behaviors that could be re-mapped can be a clear on read mask. As such, after each register 0 to 7F and from 80h to FFh the write masks 306 are provided so each bit/one or more bit(s) of each register can be indicate which are maskable upon write, and if an external device tries to write there it would have no effect. This is one of several of the configurable behaviors. For example, each of the clear on read masks 308 can also be defined separately or independently for each register or bit. Thus, without a hardware re-spin the Ethernet device 142 with Ethernet interface 122 can change the clear on read mask or other activity/behavior, how many register(s)/bit(s) are associated per device, etc. in a dynamic way based on different mappings within the configurable memory 300.

Other embodiments can comprise the design of the hardware state machine (e.g., as at least a part of the MDIO FSM 206) implemented in the MDIO controller 202 to interpret the transaction coming from outside and access right information on the physical memory based on the standardized MDIO transaction from the external host.

While the methods or process flows are illustrated and described herein as a series of acts or events, it will be appreciated that the illustrated ordering of such acts or events are not to be interpreted in a limiting sense. For example, some acts can occur in different orders/concurrently with other acts or events apart from those illustrated/described herein. In addition, not all illustrated acts could be required to implement one or more aspects or embodiments of the description herein. Further, one or more of the acts depicted herein may be carried out in one or more separate acts or phases.

FIGS. 4-13 in general describe transactions associated with the MDIO controller 202 components associated specifically with the finite state machine 206 and the re-configurable memory 300 (e.g., MDIO register(s) 204 or MDIO memory 214), for example, for flexible allocation of activities/behaviors dynamically. As discussed above, a standardized MDIO frame cellular command for read and write is processed through this FSM 206 to ultimately address the memory address that corresponds to the access desired, as an indirect addressing or mapping from a standardized logical number for a register into a flexible MDIO/MDD memory mapping corresponding to the user or client device mapping. The process further account for the standard MDIO frames received from external MDD devices with two types of general format, clause 22 and clause 45 corresponding to chapters in the IEEE 802.3 standard. These standards are complied with upon being received and then processed through the FSM to find a re-configurable or re-mapped path to the desired physical memory address and actions associated with it.

Figure 4:
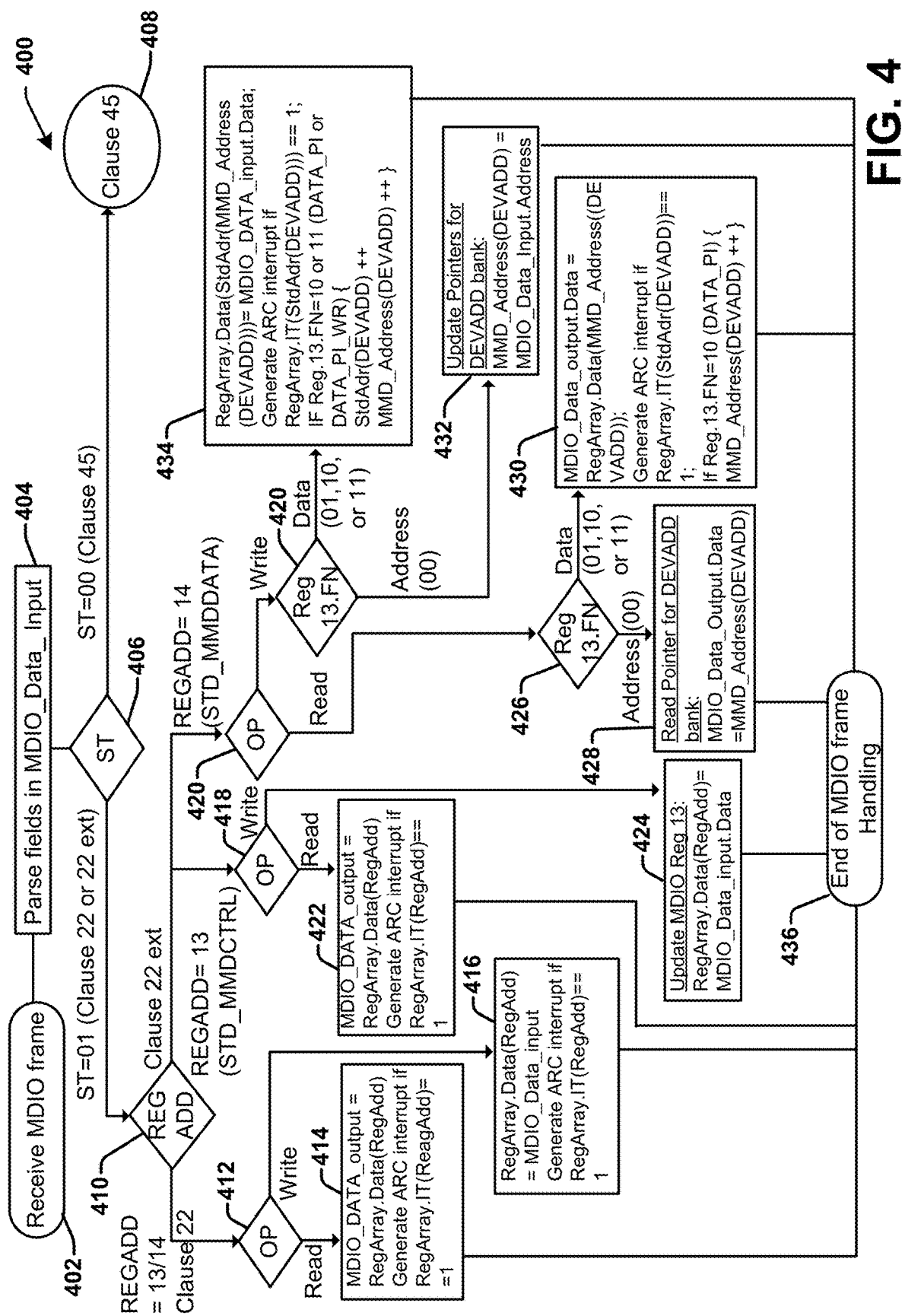
FIGS. 4-5 is an example diagram illustrating a clause 22 transaction handling and clause 45 transaction handling, respectively, to access the re-configurable register in the memory region procedure according to various aspects described.

Referring now to FIG. 4, illustrated is a process flow 400 illustrating a transaction handling to access a re-configurable register mapping of the re-configurable memory 300 of FIG. 3.

The process flow 400 initiates with receiving an MDIO frame from outside at 402 such as a master CPU (e.g., processor 135, or other internal/external processor of an Ethernet device 142. Incoming commands are accepted from an outside master to perform an operation (e.g., read or write); thus, the Ethernet device 142 or MDIO controller 202 would not necessarily initiate the transaction. The transaction could be initiated from the external master processor component, so the external master would send a frame to typically read or write for an external MMD device, in which this frame is according to/compliant with clause 22, clause 45, or an associated extension.

Figure 7:
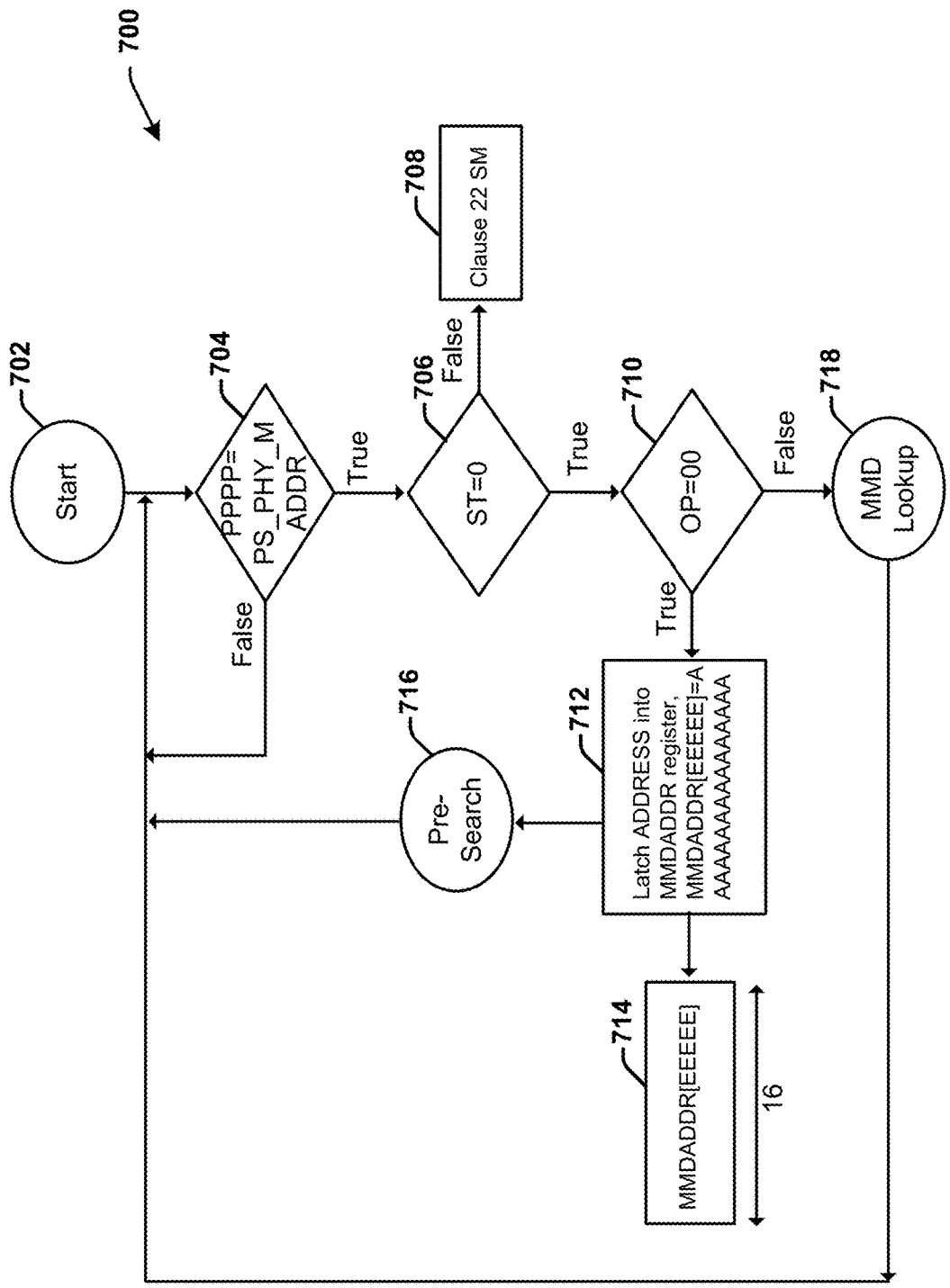
FIG. 7 is an example diagram illustrating a clause 45 transaction handling to access the re-configurable register in the memory region procedure according to various aspects described.

At 404, the MDIO frame can be parsed by parsing the fields in the MDIO input received. At 406, a check is performed for the standard (ST) bit inside this frame indicating the standard to either decrypt according to clause 22 as illustrated in further detail by the process flow 400 toward decision 410 (e.g., ST=01 for a frame based on clause 22 or 22 extension (ext)), or to the right at a process flow clause 45 (at FIG. 5). To the left side, at 410 the register address in this frame is parsed to determine by decision there-at which the path to provide or proceed by. If the register address is 13 or 14, then the operation (OP) bit is checked at 412 to determine what operation to further process such as a read or a write operation. If it is a read operation, then the data is retrieved at 414 from the physical address corresponding to this address requested (MDIO_DATA_output=RegArray.Data(RegAdd); Generate ARC (processor memory) interrupt if RegArray.IT(RegAdd)==1) and outputted with interrupt condition. Although, this process(es) can go through a search mechanism 700 that can be implemented as illustrated in FIG. 7 infra to go in a direction and retrieve from the re-configurable memory 300, or generate an interrupt, implement a clear on read or the like accordingly. Likewise, if a write is determined then the process flows to 416 at the physical address corresponding to the re-configurable memory associated with the control of the MMD address standard for data to be written as input (RegArray.Data(RegAdd)=MDIO_Data_input; Generate ARC interrupt if RegArray.IT(RegAdd)==1).

Referring briefly to FIGS. 6 and 11 illustrating an Ethernet frame 600 for clause 45 and an Ethernet frame 1100 for clause 22, respectively, a definition is labeled on top of the frame. These frames 600 and 1100 are a part of the Ethernet standard showing the standardized format with a preamble (PRE), type of standard (ST) as clause 22 or 45, the operation (OP) or operation type as an address/data write/data read/associated mask or the like, physical (PHY) device address (PRTAD), an extended device address to access additional registers (DEVAD/DEVADD), turn around (TA) used to allow time for slave retrieval of data, data or idle coming from the standard, and this can pass the receive in the intercept and implement a search mechanism in response to data being extracted from it to go in a direction for retrieving from the corresponding re-configurable memory, generate an interrupt, or implement a clear on read. For the clause 22 frame, illustrated at FIG. 11, a single frame specifies both address and the data to read or write.

For the clause 45 frame is illustrated at FIG. 6, which changes the paradigm. At first an address is then sent to specify the MMD and register. A second frame is then sent to perform the read or write. There is an advantage over clause 22 because the register space is increased from 5 bits to 16 bits, which allow an STA to access 65,536 different registers.

Accordingly, this is how the process flow 400 can proceed in FIG. 4 with read or write for register address 13 or 14 at 412. If it is 13 or 14, an indirection is thus implemented as specified in the standard or what is described in FIG. 4. Reg address 13 or 14 corresponds to a specific register in the standard, control or data. But, implements an indirection mechanism in the control that can indicate to read or write another register address, as such the indication operation can be an opposite direction, so that writing to this MMD control register 13 a specific address (e.g., if the process flow 400 goes to 416), as well to a specific data in register 14. Then the FSM will write this data or with this date from another register, in which can be also requested by the standard.

The Ethernet standard has evolved, first clause 22 and then clause 45 to have more registers, which is the purpose behind the implementation of the indirection mechanism to extend the memory range as well as for more addressing range. So these are the different evolution of the standard. The FSM 206 can support all of these Ethernet standards from clause 22, 22 extended to clause 45. The standard requires that if we use clause 22 extension, first you write from MMD control then MMD data and then it will implement in the direction mechanism. The outcome is of this FSM 206 is read and write to the correct location, but also if the re-configurable memory map was pre-initialized with a value, it takes that into account. Then the associated behavior desired to be generated depend upon user's own initialization.

Referring back to FIG. 4, similar processes to those branching from the 412 decision, can be processed in the process flow 400 if the at 410 the register address (REG ADD) in the received frame is parsed to determine by decision there-at which the path to provide or proceed by. If the register address is clause 22 extension (REGADD=13 (STD_MMDCTRL) or REGADD=13 (STD_MMDCTRL)) the process flow goes to decision 418 or 420 to determine the operation by the operation (OP) bit(s) being checked at 412 to further process a read or a write operation. If flow is to a read operation at 418, then the data is retrieved at 422 from the physical address corresponding to this address requested (MDIO_DATA_output=RegArray.Data(RegAdd); Generate ARC (processor memory) interrupt if RegArray.IT(ReagAdd)==1) and outputted with an interrupt condition. If flow is to a read operation at 418, then the data is retrieved at 422 from the physical address corresponding to this address requested (MDIO_DATA_output=RegArray. Data (RegAdd); Generate ARC (processor memory) interrupt if RegArray.IT(ReagAdd)==1) and outputted with an interrupt condition. If the process flow is to a write operation at 424, then the data is inputted by a write at the physical address (the MDIO Register) corresponding to the re-configurable memory associated with the control of the MMD address standard for data to be written as input (e.g., Update MDIO Req 13: RegArray. Data (RegAdd)=MDIO_Data_input. Data).

If the register address at 410 corresponds to standard MMD data (rather than MMD control information for REGAD=13 (STD_MMDCTRL), and a read operation at 420 is determined, then a function number (FN) can be determined at 426 to determine an address for the function. If the FN is 00, the process flows to 428 with a read pointer for the device address (DEV) bank for an address command where: Read Pointer for DEVADD bank: MDIO_Data_Output.Data=MMD_Address(DEVADD). If the FN is data with 01, 10, or 11, the process flows to 430 where MDIO_Data_output.Data=RegArray. Data (MMD_Address((DEVADD)); Generate ARC interrupt if RegArray. IT (StdAdr (DEVADD))==1; If Reg.13.FN=10 (DATA_PI) {MMD_Address(DEVADD)++}.

Likewise, if at 420 a write is determined, the process flows to 420 where a similar flow occurs for write operations. If the FN corresponds to an address 00, then the process flows to 432 to update pointers in the corresponding DEV as an address command: Update Pointers for DEVADD bank: MMD_Address(DEVADD)=MDIO_Data_Input.Address. If the process address is data corresponding to FN 01, 10, 11 then the process flows to 434 where RegArray.Data(StdAdr(MMD_Address (DEVADD)))=MDIO_DATA_input.Data; Generate ARC interrupt if RegArray.IT(StdAdr(DEVADD)))==1; IF Reg.13.FN=10 or 11 (DATA_PI or DATA_PI_WR) {StdAdr (DEVADD)++MMD_Address(DEVADD)++}. At 436, the handling or process flow of the MDIO frame ends.

Figure 5:
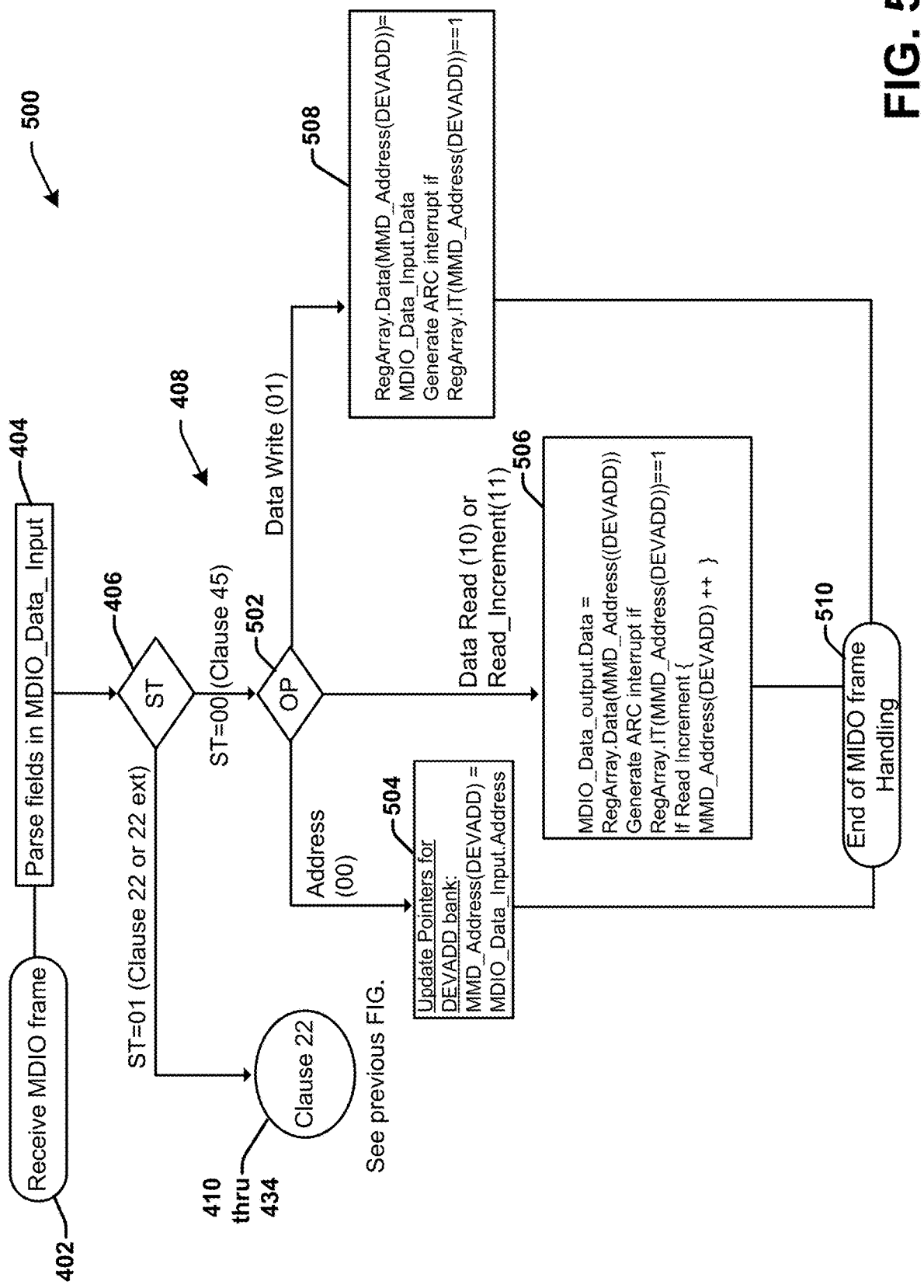

Referring to FIG. 5, illustrated is a process flow 500 illustrating a continuation of the transaction handling from the process flow 400 to access a re-configurable register mapping of the re-configurable memory 300 in response to the standard being ST=00 for a clause 45 Ethernet frame at 408 of FIG. 4. In response to the Ethernet frame being a clause 45 frame, the process 500 flows according to 408 for handling the clause 45 transaction format and retrieving data, as well as implementing the behavior defined for the reconfigurable memory mapping. At 502, the operation is determined to be a data read, a data write or an update in an address command.

If the operation is an address command (00), at 504: Update Pointers for DEVADD bank: MMD_Address(DEVADD)=MDIO_Data_Input.Address. If the operation is a data read (10) with read increment (11) according to the standard, at 506 the data is retrieved, the search is performed and put it back into the frame to answer the operation request as a read: MDIO_Data_output.Data=RegArray. Data (MMD_Address((DEVADD)); Generate ARC interrupt if RegArray.IT(MMD_Address(DEVADD))==1; If Read Increment {MMD_Address(DEVADD)++}. If the operation is a data write command (01), then a data write is performed at 508 as: MDIO_Data_output.Data=RegArray. Data (MMD_Address((DEVADD)); Generate ARC interrupt if RegArray. IT (MMD_Address(DEVADD))==1; If Read Increment {MMD_Address(DEVADD)++}. Then the process flow 500 ends at 510 as at 436 of FIG. 4.

FIGS. 7-10 and 12 further demonstrate aspects of the search and mapping of register(s) to physical address(es) depending on a memory map or memory mapping of the configurable memory 300 of the FIG. 3 table, and in order to flexibly determine different paths to map configurable MMD registers into the physical memory. FIGS. 7-10 demonstrate these tables or process flows to detail the procedure to do this decoding and mapping, and implementing the behavior/activities in a flexible way. If not flexible the 00h to 7Fh registers would be all that could be used, there would be a one to one mapping from the same address to these and it would be hard-coded. However, the other descriptors enable retrieval of the data at the right address and also allowing re-configuration of this mapping.

Referring to FIG. 7, illustrated is a detailed search process flow 700 for retrieving or processing data in a clause 45 transaction to access the re-configurable register bank of memory 300 from a clause 45 frame transaction in accordance with various aspects or embodiments herein. The process flow 700 initiates at start 702, and flows to 704 where from the PPPPPP, one of the feeds from the clause 45 transaction defines the address for the physical device. Here, at 704, a check is performed to see whether the frame is sent to a current PHY MDIO address. If false, the process flow re-cycles. If true, then it flows to the test for the standard at 706.

Similar to the above, the ST is checked at 706. If it is false, it is clause 22 and continues at 708, and if true, clause 45 to the check 710. Then the address is latched at 712 if true from the transaction into internal registers corresponding to the device address, which is requested by the transaction operation 710 where a check is performed to determine whether the type of operation is an address (00). Because it is at an address command (00), this address is stored into the configurable register MMD address for the device address EEEEE at 714, where the address is a 16 bit data in order enabling storing the internal value for the address and device desired to be accessed. At 716, a search for a matching register address is performed and the physical memory is calculated as well as the ITW/ITR behavior.

If not an address 00, the process flow 700 flows to an MMD lookup 718, such as an MMD lookup table where the data transaction (write/read/read with post-increment) is processed. The MMD lookup 718 performs the requested transaction at the appropriate physical memory.

Figure 8:
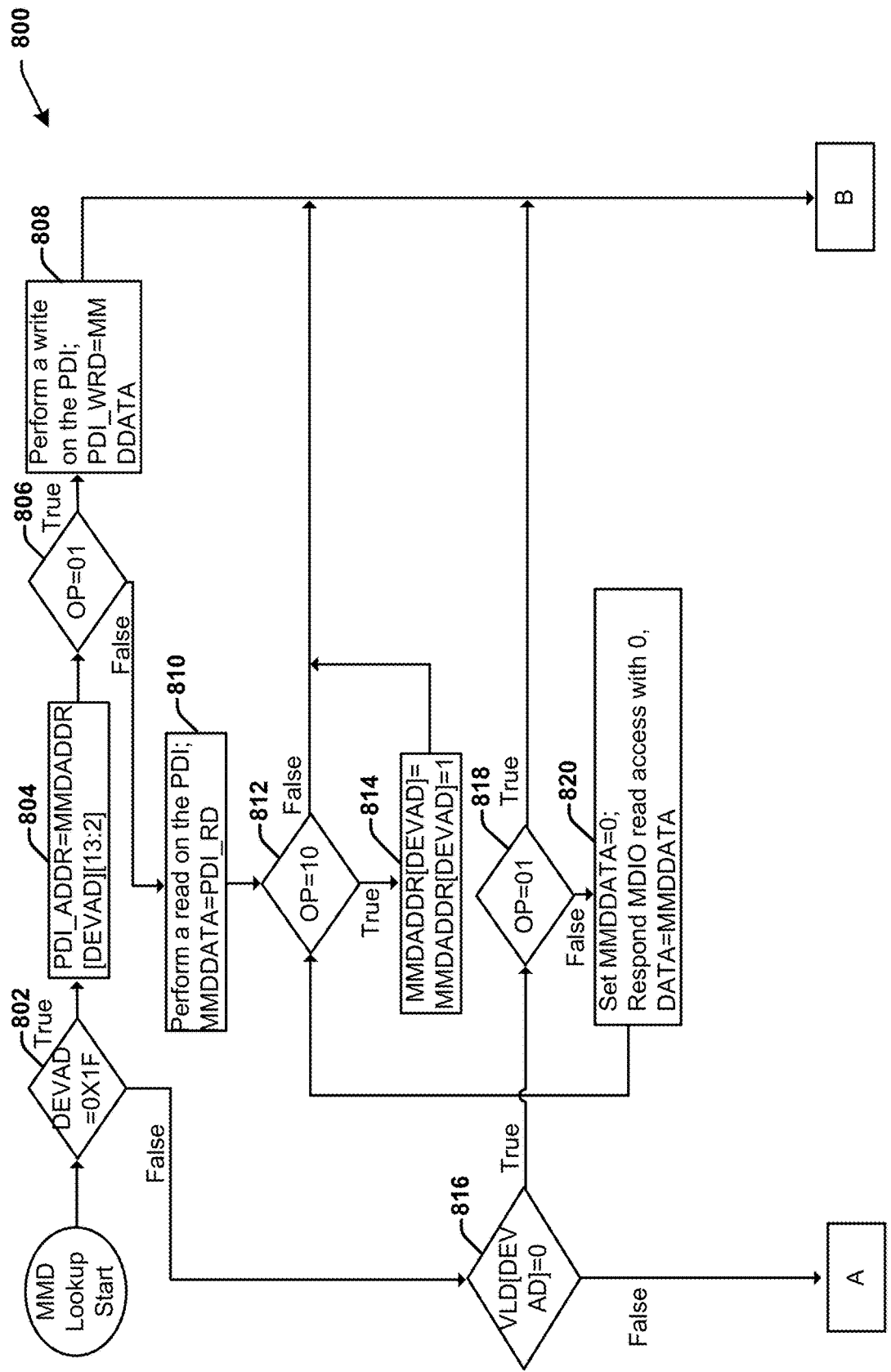
FIGS. 8-9 is a process flow for an MDIO-Management device (MMD) register lookup according to various aspects described.
Figure 9:
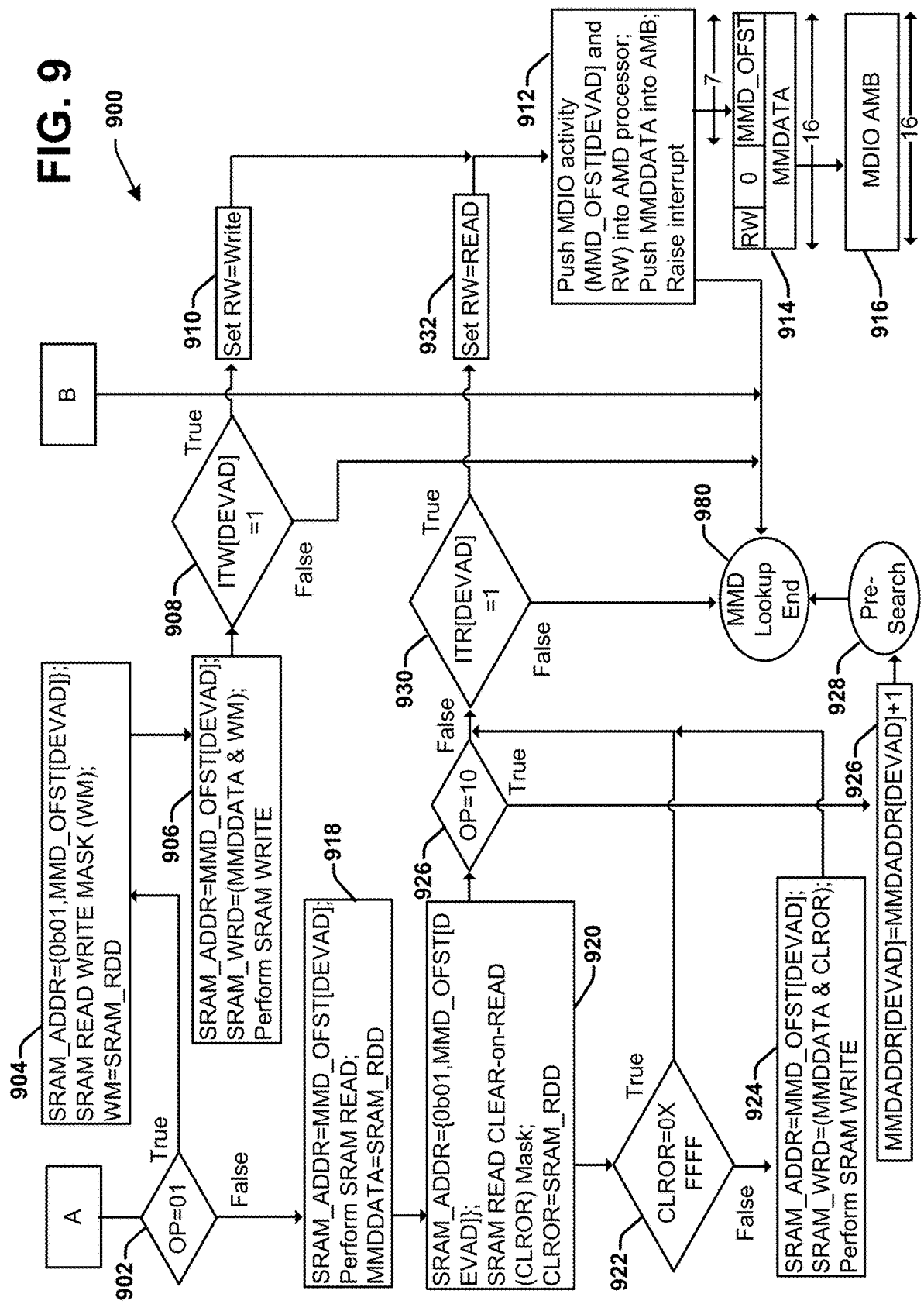

Referring to FIGS. 8-9, illustrated is a process flow detailing the MMD lookup 718, for example, as a physically search algorithm to determine the behavior and fetch the correct data for the requested transaction (activity with memory operation) at the appropriate physical memory. At 802, a check is performed to determine whether the transaction is for a device address 1F. This device address 1F is n-direction mechanism allowing extension further even further the memory addressing to the whole ARC memory, the microprocessor memory or processor 135 or other processing component.

If the device 1F is true, then a definition is made as to which physical memory address to retrieve at 804 (PDI_ADDR=MMDADDR[DEVAD][13:2]). Then at 806, a check is made if the transaction requested is for a read or write operation by checking the OP operation. If OP is 01, it is true and equates to a write operation. The process then flows to 808 to perform a write on PDI (perform a write on the PDI; PDI_WRD=MMDDATA), in which the write operation is performed by taking/accepting the data retrieved in the transaction and writing it at the correct write physical address.

But, if not 01, then equates to false and the process flows for a read to 810, where the read operation is performed (perform a read on the PDI; MMDDATA=PDI_RD). Then a check is performed at 812 as to whether there is a post increment transaction. If it is a post-increment transaction (OP=10), the address is incremented (MMDADDR[DEVAD]=MMDADDR[DEVAD]+1) at 814, then the process flows to the box B of both FIGS. 8 and 9, leading to the MMD lookup end at 980 as continued at FIG. 9 described below.

If however, the device indicated is not 1F at 816, for any other device the process flows down from the check 802 to the check 816 to determine if VLD field is zero, determining whether the transaction is for the register corresponding to the requested IEEE register address present in physical memory. If false, the process flow 800 continues to box A, which continues infra in FIG. 9 described in more detail below. If true, however, the process flow continues to check at 818 whether the OP is equal to 01 for a read operation. If true, the flow continues to box B leading to the MMD lookup end at 980 as continued at FIG. 9 infra. If false, it is a write, and the process continues to 820 and is a write, where a reply for zero for a read request on an address not found can be made (Set MMDDATA=0; Respond MDIO read access with 0; DATA=MMDDATA). After checking if it is a read or write at 818, a post increment or not is determined by flowing to the decision 812 that flows as described above.

From here at the decision 816 the process flow 800 continues as a means for passing the different fields of the transaction as illustrated at FIG. 9. If the field check at 902 is a write, then the search is performed by calculating the physical address of the register based on the offset value for the device (SRAM_ADDR={0b01, MMD_OFST [DEVAD]}; SRAM READ WRITE MASK (WM); WM=SRAM_RDD) because the device is known as well as the starting section for the device in the memory 300, which is indicated in the MMD memory offset path to perform the memory mapping. The process flows for the transaction then searches for the offset and checks the write mask. The write mask (WM) is also from the memory map or configurable memory 300. This is stored into alternative variables and then the write is performed according to the write mask at the write address that is calculated at 906 (SRAM_ADDR=MMD_OFST [DEVAD]; SRAM_WRD= (MMDDATA & WM); Perform SRAM WRITE).

Additionally, a check 908 is made if for this particular register as to whether to generate an interrupt to the processor (if it is set for an interrupt on write (ITW)) for this particular register. If the check 908 is true, the interrupt is generated to the act by setting RW to write at 910 by pushing the transaction at 912 into a FIFO called an MDIO MMD 914, which is indicating which register was accessed and from which register the interrupt is generated so later the ARC processor would be able to accept this interrupt and understand from which register this transaction happened. Then potentially a write is performed, while then preforming the behavior and activities associated with this register 916 with a change of mode, a change of parameter/activity, and implement the right behavior based on the interrupt.

Similarly, if the process flow from the decision 902 follows on the read path, an indirect addressing can be performed and retrieved according to the flexible memory mapping, and all the different offsets at the beginning of the device section. Then at 918, a read is performed on the register SRAM according to (SRAM_ADDR=MMD_OFST [DEVAD]; Perform SRAM READ; MMDDATA=SRAM_RDD). Then the mask is retrieved, the interrupt behavior is retrieved, and the activity to do thereafter.

The read is performed according to the mask and the search is performed by calculating the physical address of the register based on the offset value for the device (SRAM_ADDR={0b01, MMD_OFST [DEVAD]}; SRAM READ CLEAR on READ (CLROR) Mask; CLROR=SRAM_RDD).

At 922, the CLROR address is checked whether CLROR=0XFFFF, and if false goes to 924 to perform SRAM write with clear on read mask (SRAM_ADDR=MMD_OFST[DEVAD]; SRAM_WRD= (MMDDATA & CLROR); Perform SRAM WRITE). As such, the clear on read is performed if the CLROR mask requests it.

Additionally, a check is performed at 926 as to whether there is a post increment transaction. If it is a post-increment transaction (OP=10), the address is incremented (MMDADDR[DEVAD]=MMDADDR[DEVAD]+1) at 926, then the process flows to perform a new pre-search at 928.

If a post-increment is false at 926, then a check 930 is performed if for this particular register whether to generate an interrupt to the processor (if it is set for an interrupt on read (ITR)) for this particular register. If the check 930 is false, the MMD lookup ends at 980. If the check 930 is true, the interrupt is generated to the act by setting RW to read at 932 by pushing the transaction at 912 into a FIFO called an MDIO MMD 914, which is indicating which register was accessed and from which register the interrupt is generated so later the ARC processor would be able to accept this interrupt and understand from which register this transaction happened. Then potentially a read is performed, while then preforming the behavior and activities associated with this register 916 with a change of mode, a change of parameter/activity, and implement the right behavior based on the interrupt.

Figure 10:
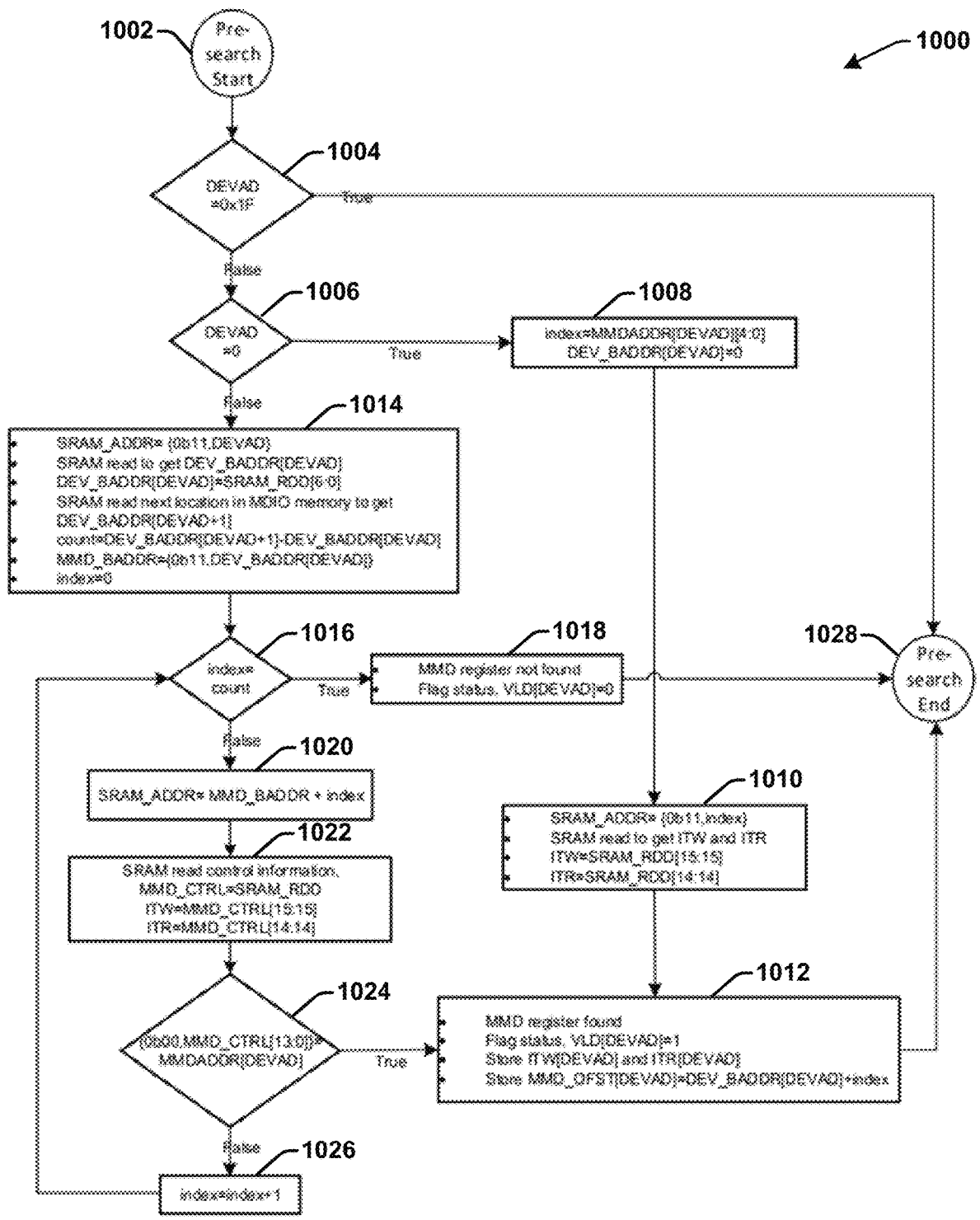
FIG. 10 is another process flow for an MMD address pre-search in accordance with various aspects described.

Referring to FIG. 10, illustrated is an example of the pre-search process flow. The pre-search 928 can be utilized for a post-increment operation as pre-search process flow 1000. For example, at the clause 45 MMDIO process flow 800 and 900, the first transaction 802 is about the address, so the external partner would send an address and then a command is sent to read or write. If a write, the data dev is provided, but if a read an immediate reply is expected from the device with the data already available. If it is a bad/failed transaction there is no other data expected to be available immediately. The pre-search 928 is performed after the address transaction is sent. To make the data and all the behavior, all the selection of the flexible mapping to all the data and calculated, the address of the physical memory, the behavior, and the clear on mask, all is be pre-searched during the address frame transaction so subsequently when a read or write is received, the register configurations are already pre-searched and pre initialized to know which physical address is to be processed. If the transaction is read, the data is already pre-searched and the data is pre-available. As such, after each address transaction, the pre-search is performed. To know what is in the subsequent round for read or write transaction the data is already pre-searched and already available and already stored in the configurable intermediate memory. This is the purpose of the pre-search, where the IEEE register address and associated device is obtained, and the process flow 1000 is performed to calculate determine the flexible mapping configuration according to the memory map 300 so that simultaneously the Ethernet device can store the behavior, store the data and know exactly which address it can do the next transaction.

At 1002, the pre-search initiates with pre-search start. At 1004, a decision is made whether the MMD device address is 0x1F. If the MMD Device address is 0x1F, it is allowed to access to GPHY IP internal registers via an internal bus called a PDI. If the MMD Device address is 0 at the decision 1006, the access is to the MDIO Clause 22 registers, which has a direct mapping; thus, at 1008 (index=MMDADDR [DEVAD][4:0]; DEV_BADDR [DEVAD]=0), and the process flows to 1010 with SRAM_ADDR={0b11, index}; SRAM read to get ITW and ITR; ITW=SRAM_RDD[15:15]; ITR=SRAM_RDD[14:14]), and to 1012 with MMD register found; Flag status, VLD[DEVAD]=1; Store ITW [DEVAD] and ITR[DEVAD]; Store MMD_OFST[DEVAD]= DEV_BADDR[DEVAD]+index.

If the Device address is not equal to those two above values, the hardware processor (e.g., 135) performs a search within its compressed MMD bank for a MMD register with a matching address in its corresponding MMD_ADDR field. Any read to a MMD register that is not found is flagged and return a value of 0 at 1018.

If the address is not a zero at 1006, and it is any other address, the process flow 1000 retrieves the device bit address corresponding to the transaction requested, which device is requested and gets what is an actual physical address that is for this particular device. It is then stored in an intermediate registers from the SRAM. Each time an SRAM is obtained on the score it relates to the flexible memory map 300. The register is read and put in intermediate registers. Thus, the result is calculating the bit address for the MMD, and a search based on the index with implementing the index and basically process through the memory 300. As such, the process flows to 1014 where a calculation is made of the range of the device register in compressed memory which corresponds to the DEVADD. Count is the size of the device. The process flows at 1014 as stated above with the following: SRAM_ADDR={0b11, DEVAD}; SRAM read to get DEV_BADDR[DEVAD]; DEV_BADDR[DEVAD]=SRAM_RDD[6:0]; SRAM read next location in MDIO memory to get DEV_BADDR[DEVAD+1]; count=DEV_BADDR[DEVAD+1]–DEV_BADDR[DEVAD]; MMD_BADDR={0b11, DEV_BADDR[DEVAD]}; index=0.

Referring briefly to FIG. 3, there is a mapping at the address 1A0h and 1A1h as an MMD address in the control 310. This is the address that is obtained from the IEEE standard, so and its mapped to each of the MMD registers 0F to 7F to indicate what IEEE register number corresponds thereto. So 0F to 7F is the physical registers that have a correspondence mapping with IEEE register number, the one behind it can stand out, which can be different. As such, the pre-search 1000 is about mapping/finding if the IEEE register number from the transaction is present in the mapping or not. If not, then nothing is done. If it is, then a search is made in this table to find the exact physical address in order to ascertain a correspondence between the IEEE register number and the physical memory map 300 regions.

Thus, at 1016 of FIG. 10, a decision on the index is made where a physical check is performed if the address of the transaction is present in the configurable memory table (e.g., vis the FSM) table (e.g., yes/no) and then end up with MMD register found at 1012. If it is not found, then the process flows to 1018 with MMD register not found; Flag status;

VLD [DEVAD]=0. If it is found, then all the data interrupt behavior offset is stored and all this corresponding to the register found. At 1020 the process flows to set the SRAM_ADDR=MMD_BADDR+index. At 1022, SRAM read control information is obtained; MMD CTRL=SRAM_RDD; ITW=MMD CTRL[15:15]; ITR=MMD CTRL[14:14]. The decision at 1024 is performed whether the physical address with the data is equal to the configured address as {0b00,MMD_CTRL [13:0]}=MMDADDR[DEVAD]. If not, then the search is indexed at 1026 and re-cycled to the index=count at 1016. If so, then the process flows to 1012 with the MMD register being found. Then the search ends at 1018, and all the data is stored in internal registers and available for the next transaction.

Figure 12:
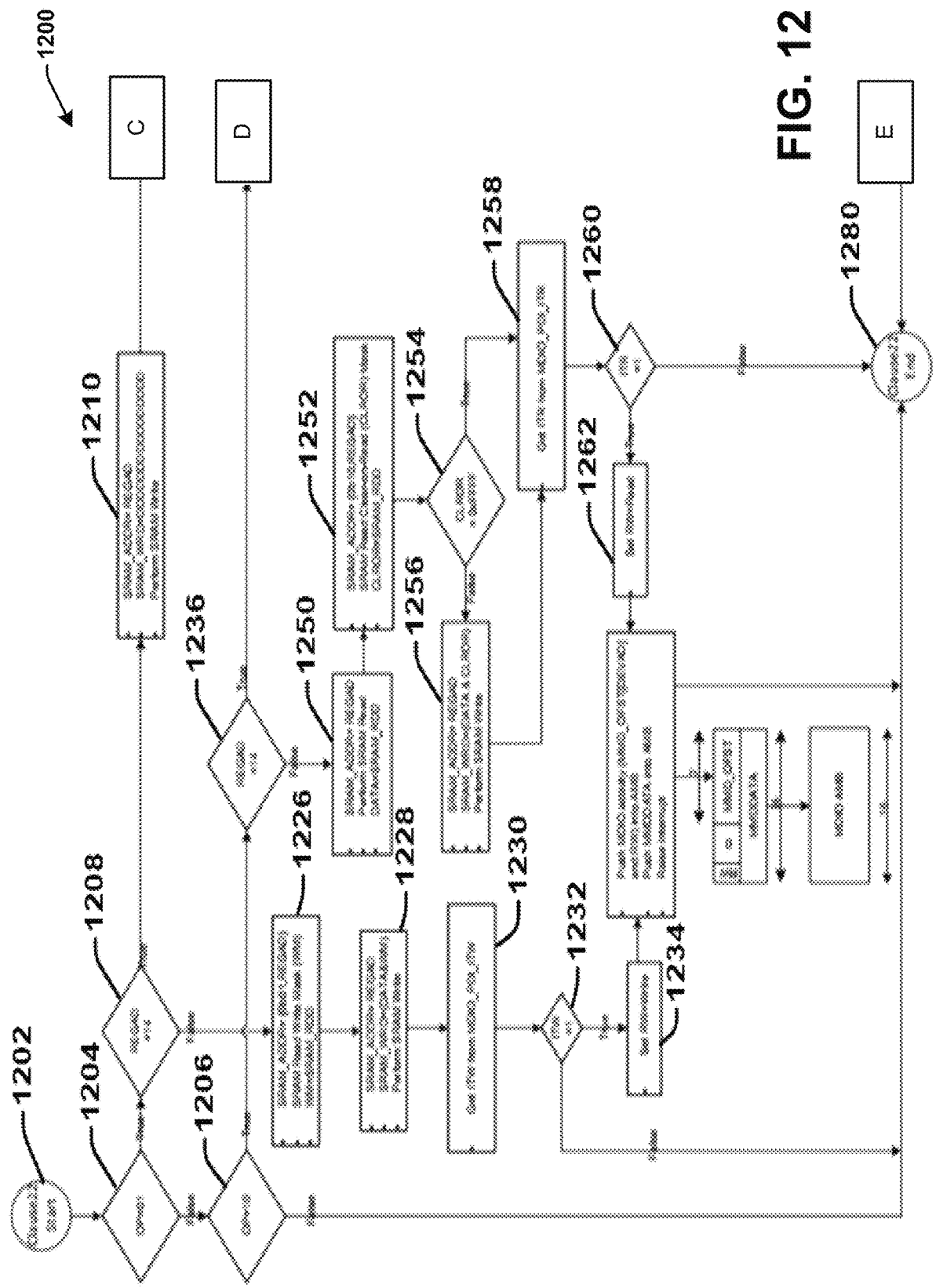
FIGS. 12-13 is an example clause 45 transaction in a finite state machine to access the re-configurable register bank in accordance with various aspects described.
Figure 13:
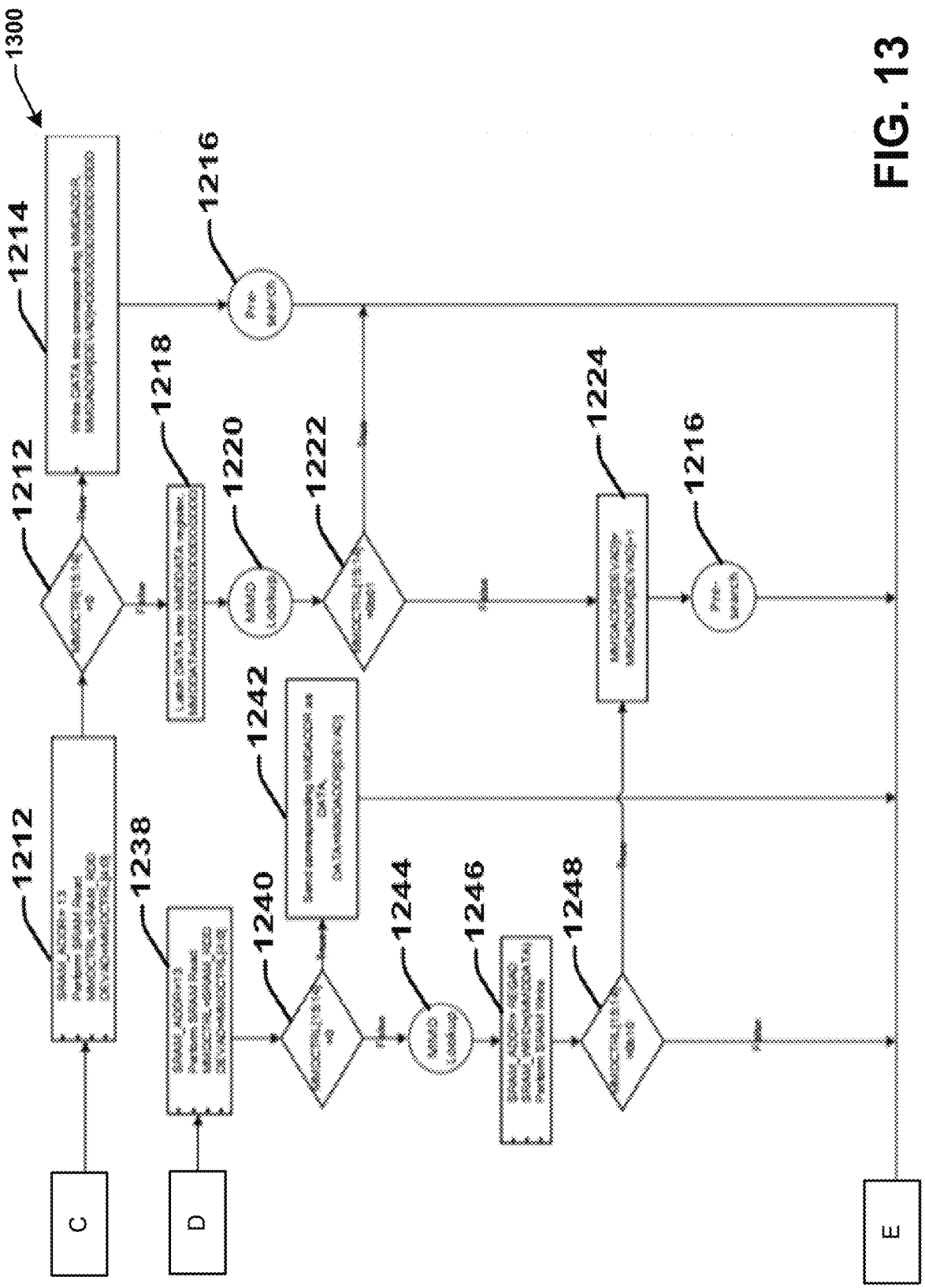

Referring to FIGS. 11-13, illustrated is an example of clause 22 frame 1100 and a clause 22 transaction FSM process flow 1200 and 1300 to access the re-configurable register bank or memory 300, as a similar search process flow that corresponds to the clause 22 frame format with a slightly different format from the standard. FIGS. 12 and 13 demonstrate process flows 1200 and 1300 as a continuous process flow that continue at paths designated at box C, D and E to designate a break for a continuous path between the two figures.

At 1202 the process flow initiates. At 1204 and 1206, a decision is made at to which operation the transaction is: a write at 1204 or a read at 1206. Then a check of the register (reg) address is performed. At 1208, a decision if the register address is REGADD=14, or not, is made, as with 410 of FIG. 4. If REGAD=14, then at 1210 a write is performed in the control: SRAM_ADDR=REGAD; SRAM_WRD=0000000000000000; perform SRAM write. At 1012, a read is performed: SRAM=13; Perform SRAM read; MMDCTRL-SRAM_RDD; DEVAD=MMDCTRL[4:0].

At 1214, a handling of the indirect MMD access using the clause 22 indirection method is performed: MMDCTR[15: 14]=0. An interpretation of MMD register STD_MMDC-TRL[15:14] as per section 22.2.4.3.12 of IEEE standard is as follows: a) when set to 00, accesses to Register 14 access the MMD's individual address register, in which this address register should always be initialized before attempting any accesses to other MMD registers; b) when set to 01, accesses to Register 14 access the register within the MMD selected by the value in the MMD's address register; c) when set to 10, accesses to Register 14 access the register within the MMD selected by the value in the MMD's address register, in which after that access is complete, for both read and write accesses, the value in the MMD's address field is incremented; d) When set to 11, accesses to Register 14 access the register within the MMD selected by the value in the MMD's address register, in which After that access is complete, for write accesses only, the value in the MMD's address field is incremented. For read accesses, the value in the MMD's address field is not modified.

If the indecision is true at 1212, the process flows to 1214 with: Write DATA into corresponding MMDADDR; MMDADDR[DEVAD]=0000000000000000, and then to pre-search 1216 as in FIG. 10 pre-search 1000, and ending at 1280.

If the indecision at 1212 is not true, the process flows to 1218 with a latch of data to the MMD register with: Latch DATA into MMDDATA register; MMD-DATA=0000000000000000. At 1220 the MMD lookup process flow is performed, and at 1222 for an increment handling, a decision if the control address is 0b01 or not is made with: MMDCTRL[15:14]=0b01. If true, the process ends at 1280, but if false, then flows to 1224 to increment as a write increment with: MMDADDR[DEVAD]= MMDAD-DR[DEVAD]+1. The pre-search as at 1216 can then be performed before ending at 1280.

If the decision at 1208 is false, then the process flows to 1226 for a write operation for a clause 22 register with write mask handling with: SRAM_ADDR={0b06, REGAD}; SRAM Read Write Mask (WM); WM=SRAM_RDD. At 1228, a write is perform as with: SRAM_ADDR=REGAD; SRAM_WRD=(DATA & WM); Perform SRAM write. Then at 1230, get the interrupt from MDIO_PDI_ITW with: Get ITW from MDIO_PDI_ITW.

At 1232, a decision if an write interrupt is present is made as with: ITW=1. If false, the process flow ends at 1280. If true, the process flows with a set RW=write for a write operation. The process flow 1200 then continues as 912 thru 916 of FIG. 9, with: Push MDIO activity (MMD_OFST [DEVAD] and RW) into AMB; Push MMDDATA into AMB; Raise interrupt.

Along the read path from decision 1206, a decision 1236 is made similar to 1208 for a REGAD=14 or not. If true, the process flows to retrieve MMD device address from STD_MMDCTRL in register 13 at 1238 with: SRAM_A-DDR=13; Perform SRAM READ; MMDCTRL=SRAM_RDD; DEVAD=MMDCTRL[4:0].

A check for an indecision similar to the check decision at 1212 for the read path is performed. If true, then data corresponding to the register is sent at 1242 with: Send corresponding MMDADDR as DATA; DATA=MMDADDR[DEVAD]. If false, an MMD lookup is performed at 1244, and an SRAM write is performed at 1246 with: SRAM_ADDR=REGAD; SRAM_WRD=(MMD-DATA); Perform SRAM write. At 1248, an address check is then made with MDCTRL[15:14]=0b10 as a read post increment. If true, the process flows to 1224 for a write increment, but if false, ends at 1280

If the check of the address=14 at 1236 is false, then the process flows to 1250 for a read operation for a clause 22 register with clear on read mask handling. At 1250, an SRAM read is performed with: SRAM_ADDR=REGAD; Perform SRAM Read; DATA=SRAM_RDD. At 1252, a clear on read mask is determined for an address as with: SRAM_ADDR={0b10, REGAD; SRAM READ Clear-on-Read (CLOR) Mask; CLROR=SRAM_RDD.

A decision at 1254 is made for a clear on read address determination. If false, at 1256, an SRAM write is performed with SRAM_ADDR=REGAD; SRAM_WRD= (DATA & CLOR); Perform SRAM write. At 1258 the process then flows to get an interrupt read with: Get ITR from MDIO_PDI_ITR. The process then determines a read interrupt. If false, the process ends, if true, then at 1262 a read flag is set with Set RW=Read. The process flow 1200 then continues as 912 thru 916 of FIG. 9, with: Push MDIO activity (MMD_OFST[DEVAD] and RW) into AMB; Push MMDDATA into AMB; Raise interrupt.

Figure 14:
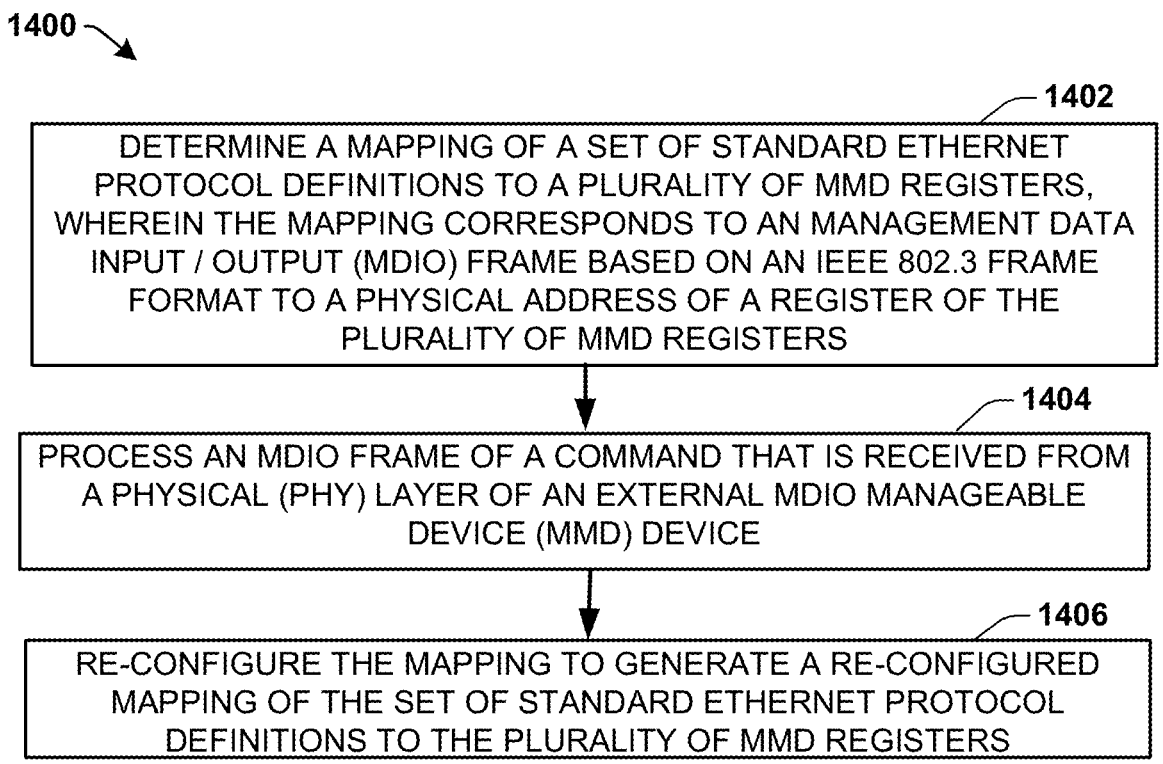
FIG. 14 is an example process flow for re-configurable memory mapping in accordance with various aspects described.

Referring to FIG. 14, illustrated is an example process flow 1300 for a method of an Ethernet device to re-configure a register mapping. The method comprises determining at 1402, via an MDIO controller, a mapping of a set of standard Ethernet protocol definitions to a plurality of MMD registers, wherein the mapping corresponds to an Management Data Input/Output (MDIO) frame based on an IEEE 802.3 frame format to a physical address of a register of the plurality of MMD registers.

At 1404, the method comprises processing, via the MDIO controller, an MDIO frame of a command that is received from a physical (PHY) layer of an external MDIO Manageable Device (MMD) device.

At 1406, the method comprises re-configuring, via the MDIO controller, the mapping to generate a re-configured mapping of the set of standard Ethernet protocol definitions to the plurality of MMD registers.

The method can also include generating a determination of whether the MDIO frame of the command relates to an IEEE 802.3 clause 22 frame format or an IEEE 802.3 clause 45 frame format; determining a path to the physical address based on the determination, an action associated with the command, and the re-configured mapping of the set of standard Ethernet protocol definitions to the plurality of MMD registers.

Further, the method can include re-configuring a physical memory table by dis-associating an action with a read or write operation from at least a portion of bits of a first register of the plurality of MMD registers, or associating the action with the read or write operation to at least another portion of the bits of the first register of the plurality of MMD registers or to a second MMD device, based on the re-configured mapping by the MDIO controller.

In another aspect, the method can also include re-assigning an action or a command from the external MMD device from a first MMD register to a second different MMD register of the plurality of MMD registers; and generating an indirect mapping via a finite state machine from a standard logical number of the IEEE 802.3 frame format associated with the action or the command of the MDIO register to a physical address of the second MDIO register of the plurality of MMD registers that is re-assigned the action or the command.

As used herein, the term "circuitry" can refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry can be implemented in, or functions associated with the circuitry can be implemented by, one or more software or firmware modules. In some embodiments, circuitry can include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor can also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, non-volatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Other examples of the various aspects/embodiments herein can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

In one example, the subject matter includes an apparatus of an Ethernet device comprising a plurality of Management Data Input/Output (MDIO) Manageable Device (MMD) registers configured to store a set of standard Ethernet protocol definitions that operate a management interface to one or more MMD devices; and an MDIO controller, communicatively coupled to the plurality of MMD registers, configured to: control communication via the management interface to the one or more MMD devices based on a mapping of the set of standard Ethernet protocol definitions to the plurality of MMD registers; and modify the mapping of the set of standard Ethernet protocol definitions to the plurality of MMD registers by modifying the set of standard Ethernet protocol definitions associated with a first MMD register of the plurality of MMD registers in response to being operably coupled to a first MMD device of the one or more MMD devices.

In a second example that can include the subject matter of the first example, the MDIO controller is further configured to modify the mapping based on a set of criteria comprising at least one of: a reset value, a number of registers of the plurality of MMD registers associated with the first MMD device or a second MMD device, a number of published registers, or a function associated with a first set of bits of the plurality of MMD registers.

In a third example that can include the subject matter of any one or more of the first and second example, the MDIO controller is further configured to modify the set of standard Ethernet protocol definitions associated with the first MMD register to a second MMD registers that is different from the first register based on the set of criteria.

In a fourth example that can include the subject matter of any one or more of the first thru third example, the MDIO controller is further configured to modify the set of standard Ethernet protocol definitions associated with the first MMD register in response to an initialization of the first MMD device or of an additional second MMD device, wherein the set of standard Ethernet protocol definitions comprise a set of IEEE 802.3 clause 22 definitions, a set of IEEE 802.3 clause 45 definitions, or both the IEEE 802.3 clause 22 definitions and IEEE 802.3 clause 45 definitions.

In a fifth example that can include the subject matter of any one or more of the first thru fourth example, the MDIO controller is further configured to re-configure the set of standard Ethernet protocol definitions associated with the first MMD register by allocating a different function to be processed in response to a read or write command from the first MMD device with a second MMD register or a different subset of bits of the first MMD register than an initial subset of bits of the first MMD register.

In a sixth example that can include the subject matter of any one or more of the first thru fifth example, the different function comprises at least one of: a clear on read, a mask on write, a mask on read, an interrupt of the MDIO controller, a default value, or a reserve function associated with one or more bits of first MMD register or the second MMD register.

In a seventh example that can include the subject matter of any one or more of the first thru sixth example, the MDIO controller is further configured to: process a command from the first MMD device with a physical address of the first MMD register based on a physical memory table that associates a number of bits of the first MMD register to the command based on the mapping; and generate a re-configuration of the physical memory table that associates a different number of bits, or one or more different bits of the first MMD register to the command from the first MMD device, or associates the number of bits of the first MMD register to a second MMD device that is different from the first MMD device.

In a eighth example that can include the subject matter of any one or more of the first thru seventh examples, the MDIO controller comprises a finite state machine configured to: process another command that is received externally from the Ethernet device from the one or more MMD devices; generate a determination of whether the transaction comprises an IEEE standard clause 22 frame or an IEEE standard clause 45 frame; and based on the re-configuration of the physical memory table and on the determination, determine a path to the physical memory address associated with the another command.

In a ninth example that can include the subject matter of any one or more of the first thru eight examples, wherein the MDIO controller is further configured to: allocate a first subset of the plurality of MMD registers to the first MMD device and a second subset of the plurality of MMD registers to a second MMD device; and re-allocate the first subset of the plurality of MMD registers so that one or more bits of the first subset of the plurality of MMD registers corresponds to the second MMD device at an initialization operation with at least one of: the first MMD device or the second MMD device.

In a tenth example that can include the subject matter of any any one or more of the first thru ninth examples, wherein the MDIO controller is further configured to dynamically re-allocate at least a part of the plurality of MMD registers among up to thirty-two MMD devices in response to being coupled to or receiving a command from one or more of the up to thirty-two MMD devices.

An eleventh example can comprise a system employed in an Ethernet device comprising: a plurality of Management Data Input/Output (MDIO) Manageable Device (MMD) registers comprising a set of standard Ethernet protocol definitions; and an MDIO controller, communicatively coupled to the plurality of MMD registers, configured to: enable communications via an interface based on a set of standard Ethernet protocol definitions with one or more physical layers of at least one MMD device based on a mapping of the set of standard Ethernet protocol definitions to the plurality of MMD registers; and generate a re-configured mapping of the set of standard Ethernet protocol definitions to the plurality of MMD registers by re-configuring bits of the plurality of MMD registers associated with a first criteria of the standard Ethernet protocol definitions to a second criteria that is different from the first criteria.

In a twelfth example that can include the subject matter of any one or more of the eleventh example, the first criteria comprises a first MMD device operably coupled to the interface and external to the MDIO controller, and the second criteria comprises a second MMD device operably coupled to the interface and external to the MDIO controller.

In a thirteenth example that can include the subject matter of any one or more of the eleventh thru twelfth example, the first criteria comprises a first operation that comprises a function related to a read command or a published register address, and the second criteria comprises a second operation that comprises a function related to the read command or a different published register address.

In a fourteenth example that can include the subject matter of any one or more of the eleventh thru thirteenth examples, the MDIO controller is further configured to receive a command from the at least one MMD device, determine whether the command comprises a frame related to an IEEE standard clause 22 frame or an IEEE standard clause 45 frame, and execute the command based on the re-configured mapping with the re-configured bits and a physical memory table comprising physical register addresses associated with the plurality of MMD registers, respectively.

In a fifteenth example that can include the subject matter of the eleventh thru fourteenth examples, the MDIO controller is further configured to associate subsets of the plurality of MMD registers to different MMD devices at an initialization operation that is different from the mapping of the set of standard Ethernet protocol definitions to the plurality of MMD registers.

In a sixteenth example that can include the subject matter of the eleventh thru fifteenth examples, further comprising: a finite state machine configured to determine a path to a physical address of at least one of the plurality of MMD registers based on a frame of a command input with an indication of at least one of: a function, another address, an action or a request from the at least one MMD device, and the re-configured mapping of the set of standard Ethernet protocol definitions.

In a seventeenth example that can include the subject matter of the eleventh thru sixteenth examples, further comprising: a physical memory table configured that disassociates a particular function with a command from at least a portion of bits of a first register of the plurality of MMD registers, and associates the particular function with the command or with another command to at least another portion of the bits of the first register of the plurality of MMD registers or to a second MMD device, based on the re-configured mapping by the MDIO controller.\

An eighteenth example can comprise a method of an Ethernet device to re-configure a register mapping comprising: determining, via an MDIO controller, a mapping of a set of standard Ethernet protocol definitions to a plurality of MMD registers, wherein the mapping corresponds to an Management Data Input/Output (MDIO) frame based on an IEEE 802.3 frame format to a physical address of a register of the plurality of MMD registers; processing, via the MDIO controller, an MDIO frame of a command that is received from a physical (PHY) layer of an external MDIO Manageable Device (MMD) device; and re-configuring, via the MDIO controller, the mapping to generate a re-configured mapping of the set of standard Ethernet protocol definitions to the plurality of MMD registers.

In a nineteenth example that can include the subject matter of the eighteenth example, the method further comprises: generating a determination of whether the MDIO frame of the command relates to an IEEE 802.3 clause 22 frame format or an IEEE 802.3 clause 45 frame format; determining a path to the physical address based on the determination, an action associated with the command, and the re-configured mapping of the set of standard Ethernet protocol definitions to the plurality of MMD registers.

In a twentieth example that can include the subject matter of any one or more of the eighteenth thru nineteenth examples, further comprising: re-configuring a physical memory table by dis-associating an action with a read or write operation from at least a portion of bits of a first register of the plurality of MMD registers, or associating the action with the read or write operation to at least another portion of the bits of the first register of the plurality of MMD registers or to a second MMD device, based on the re-configured mapping by the MDIO controller.

In a twenty-first example that can include the subject matter of any one or more of the eighteenth thru twentieth examples, further comprising: re-assigning an action or a command from the external MMD device from a first MMD register to a second different MMD register of the plurality of MMD registers; and generating an indirect mapping via a finite state machine from a standard logical number of the IEEE 802.3 frame format associated with the action or the command of the MDIO register to a physical address of the second MDIO register of the plurality of MMD registers that is re-assigned the action or the command.

In a twenty-second example that can include the subject matter of any one or more of the eighteenth thru twenty-first examples, the action or the command comprises at least one of: a clear on read function, a mask on read function, a mask on write function, a reserve function, a reset value or a publish designation.

In a twenty-third example that can include the subject matter of any one or more of the eighteenth thru twenty-second examples, further comprising: allocating the second different MMD register to the external MMD device for the action or the command via the finite state machine.

In a twenty-fourth example that can include the subject matter of any one or more of the eighteenth thru twenty-third examples, further comprising: in response to receiving the MDIO frame, determining the action or the command from the frame and whether the MDIO frame is from the external MMD device from among a plurality of connected MMD devices; and retrieving data from the physical address and generating the action or the command based on a search mechanism enabled by the finite state machine indirectly mapping the physical address with the action or the command from the external MMD device.

Examples can include an apparatus comprising means to perform one or more elements of a method described in or related to any of examples (embodiments) above, or any other method or process described herein.

Examples can include one or more non-transitory computer-readable media comprising instructions to cause an electronic device, upon execution of the instructions by one or more processors of the electronic device, to perform one or more elements of a method described in or related to any of examples above, or any other method or process described herein.

Examples can include an apparatus comprising logic, modules, or circuitry to perform one or more elements of a method described in or related to any of examples above, or any other method or process described herein.

Examples can include a method, technique, or process as described in or related to any of examples above, or portions or parts thereof.

Examples can include an apparatus comprising: one or more processors and one or more computer readable media comprising instructions that, when executed by the one or more processors, cause the one or more processors to perform the method, techniques, or process as described in or related to any of examples above, or portions thereof.

Examples can include a method of communicating in a wireless network as shown and described herein.

Examples can include a system for providing wireless communication as shown and described herein.

Examples can include a device for providing wireless communication as shown and described herein.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature can have been disclosed with respect to only one of several implementations, such feature can be combined with one or more other features of the other implementations as can be desired and advantageous for any given or particular application.

What is claimed is:

1. An apparatus of an Ethernet device comprising:
a plurality of Management Data Input/Output (MDIO) Manageable Device (MMD) registers configured to store a set of standard Ethernet protocol definitions that operate a management interface to one or more MMD devices; and
an MDIO controller, communicatively coupled to the plurality of MMD registers, configured to:
control communication via the management interface to the one or more MMD devices based on a mapping of the set of standard Ethernet protocol definitions to the plurality of MMD registers; and
modify the mapping of the set of standard Ethernet protocol definitions to the plurality of MMD registers by modifying the set of standard Ethernet protocol definitions associated with a first MMD register of the plurality of MMD registers in response to being operably coupled to a first MMD device of the one or more MMD devices.

2. The apparatus of claim 1, wherein the MDIO controller is further configured to modify the mapping based on a set of criteria comprising at least one of: a reset value, a number of registers of the plurality of MMD registers associated with the first MMD device or a second MMD device, a number of published registers, or a function associated with a first set of bits of the plurality of MMD registers.

3. The apparatus of claim 2, wherein the MDIO controller is further configured to modify the set of standard Ethernet protocol definitions associated with the first MMD register to a second MMD registers that is different from the first register based on the set of criteria.

4. The apparatus of claim 1, wherein the MDIO controller is further configured to modify the set of standard Ethernet protocol definitions associated with the first MMD register in response to an initialization of the first MMD device or of an additional second MMD device, wherein the set of standard Ethernet protocol definitions comprise a set of IEEE 802.3 clause 22 definitions, a set of IEEE 802.3 clause 45 definitions, or both the IEEE 802.3 clause 22 definitions and IEEE 802.3 clause 45 definitions.

5. The apparatus of claim 1, wherein the MDIO controller is further configured to re-configure the set of standard Ethernet protocol definitions associated with the first MMD register by allocating a different function to be processed in response to a read or write command from the first MMD device with a second MMD register or a different subset of bits of the first MMD register than an initial subset of bits of the first MMD register.

6. The apparatus of claim 5, wherein the different function comprises at least one of: a clear on read, a mask on write, a mask on read, an interrupt of the MDIO controller, a default value, or a reserve function associated with one or more bits of first MMD register or the second MMD register.

7. The apparatus of claim 1, wherein the MDIO controller is further configured to:
process a command from the first MMD device with a physical address of the first MMD register based on a physical memory table that associates a number of bits of the first MMD register to the command based on the mapping; and
generate a re-configuration of the physical memory table that associates a different number of bits, or one or more different bits of the first MMD register to the command from the first MMD device, or associates the number of bits of the first MMD register to a second MMD device that is different from the first MMD device.

8. The apparatus of claim 7, wherein the MDIO controller comprises a finite state machine configured to:
process another command that is received externally from the Ethernet device from the one or more MMD devices;
generate a determination of whether the transaction comprises an IEEE standard clause 22 frame or an IEEE standard clause 45 frame; and
based on the re-configuration of the physical memory table and on the determination, determine a path to the physical memory address associated with the another command.

9. The apparatus of claim 1, wherein the MDIO controller is further configured to:
allocate a first subset of the plurality of MMD registers to the first MMD device and a second subset of the plurality of MMD registers to a second MMD device; and
re-allocate the first subset of the plurality of MMD registers so that one or more bits of the first subset of the plurality of MMD registers corresponds to the second MMD device at an initialization operation with at least one of: the first MMD device or the second MMD device.

10. The apparatus of claim 9, wherein the MDIO controller is further configured to dynamically re-allocate at least a part of the plurality of MMD registers among up to thirty-two MMD devices in response to being coupled to or receiving a command from one or more of the up to thirty-two MMD devices.

11. A system employed in an Ethernet device comprising:
a plurality of Management Data Input/Output (MDIO) Manageable Device (MMD) registers comprising a set of standard Ethernet protocol definitions; and
an MDIO controller, communicatively coupled to the plurality of MMD registers, configured to:
enable communications via an interface based on a set of standard Ethernet protocol definitions with one or more physical layers of at least one MMD device based on a mapping of the set of standard Ethernet protocol definitions to the plurality of MMD registers; and
generate a re-configured mapping of the set of standard Ethernet protocol definitions to the plurality of MMD registers by re-configuring bits of the plurality of MMD registers associated with a first criteria of the standard Ethernet protocol definitions to a second criteria that is different from the first criteria.

12. The system of claim 11, wherein the first criteria comprises a first MMD device operably coupled to the interface and external to the MDIO controller, and the second criteria comprises a second MMD device operably coupled to the interface and external to the MDIO controller.

13. The system of claim 11, wherein the first criteria comprises a first operation that comprises a function related to a read command or a published register address, and the second criteria comprises a second operation that comprises a function related to the read command or a different published register address.

14. The system of claim 11, wherein the MDIO controller is further configured to receive a command from the at least one MMD device, determine whether the command comprises a frame related to an IEEE standard clause 22 frame or an IEEE standard clause 45 frame, and execute the command based on the re-configured mapping with the re-configured bits and a physical memory table comprising physical register addresses associated with the plurality of MMD registers, respectively.

15. The system of claim 11, wherein the MDIO controller is further configured to associate subsets of the plurality of MMD registers to different MMD devices at an initialization operation that is different from the mapping of the set of standard Ethernet protocol definitions to the plurality of MMD registers.

16. The system of claim 11, further comprising:
a finite state machine configured to determine a path to a physical address of at least one of the plurality of MMD registers based on a frame of a command input with an indication of at least one of: a function, another address, an action or a request from the at least one MMD device, and the re-configured mapping of the set of standard Ethernet protocol definitions.

17. The system of claim 11, further comprising:
a physical memory table configured that dis-associates a particular function with a command from at least a portion of bits of a first register of the plurality of MMD registers, and associates the particular function with the command or with another command to at least another portion of the bits of the first register of the plurality of MMD registers or to a second MMD device, based on the re-configured mapping by the MDIO controller.

18. A method of an Ethernet device to re-configure a register mapping comprising:
determining, via an MDIO controller, a mapping of a set of standard Ethernet protocol definitions to a plurality of MMD registers, wherein the mapping corresponds to an Management Data Input/Output (MDIO) frame based on an IEEE 802.3 frame format to a physical address of a register of the plurality of MMD registers;
processing, via the MDIO controller, an MDIO frame of a command that is received from a physical (PHY) layer of an external MDIO Manageable Device (MMD) device; and
re-configuring, via the MDIO controller, the mapping to generate a re-configured mapping of the set of standard Ethernet protocol definitions to the plurality of MMD registers.

19. The method of claim 18, further comprising:
generating a determination of whether the MDIO frame of the command relates to an IEEE 802.3 clause 22 frame format or an IEEE 802.3 clause 45 frame format;
determining a path to the physical address based on the determination, an action associated with the command, and the re-configured mapping of the set of standard Ethernet protocol definitions to the plurality of MMD registers.

20. The method of claim 18, further comprising:
re-configuring a physical memory table by dis-associating an action with a read or write operation from at least a portion of bits of a first register of the plurality of MMD registers, or associating the action with the read or write operation to at least another portion of the bits of the first register of the plurality of MMD registers or to a second MMD device, based on the re-configured mapping by the MDIO controller.

21. The method of claim 18, further comprising:
re-assigning an action or a command from the external MMD device from a first MMD register to a second different MMD register of the plurality of MMD registers; and
generating an indirect mapping via a finite state machine from a standard logical number of the IEEE 802.3 frame format associated with the action or the command of the MDIO register to a physical address of the second MDIO register of the plurality of MMD registers that is re-assigned the action or the command.

22. The method of claim 21, wherein the action or the command comprises at least one of: a clear on read function, a mask on read function, a mask on write function, a reserve function, a reset value or a publish designation.

23. The method of claim 21, further comprising:
allocating the second different MMD register to the external MMD device for the action or the command via the finite state machine.

24. The method of claim 21, further comprising:
in response to receiving the MDIO frame, determining the action or the command from the frame and whether the MDIO frame is from the external MMD device from among a plurality of connected MMD devices; and
retrieving data from the physical address and generating the action or the command based on a search mechanism enabled by the finite state machine indirectly mapping the physical address with the action or the command from the external MMD device.

* * * * *